US010535129B2

(12) United States Patent
Kitazawa et al.

(10) Patent No.: US 10,535,129 B2
(45) Date of Patent: Jan. 14, 2020

(54) PATTERN MATCHING APPARATUS AND COMPUTER PROGRAM

(75) Inventors: Masahiro Kitazawa, Honjo (JP); Mitsuji Ikeda, Hitachinaka (JP); Yuichi Abe, Mito (JP); Junichi Taguchi, Sagamihara (JP); Wataru Nagatomo, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 411 days.

(21) Appl. No.: 13/981,963

(22) PCT Filed: Dec. 7, 2011

(86) PCT No.: PCT/JP2011/006834
§ 371 (c)(1),
(2), (4) Date: Oct. 9, 2013

(87) PCT Pub. No.: WO2012/101717
PCT Pub. Date: Aug. 2, 2012

(65) Prior Publication Data
US 2014/0023265 A1    Jan. 23, 2014

(30) Foreign Application Priority Data

Jan. 26, 2011 (JP) .................. 2011-013562

(51) Int. Cl.
*G06T 7/00* (2017.01)
(52) U.S. Cl.
CPC .................. *G06T 7/0004* (2013.01)
(58) Field of Classification Search
CPC . G06T 2207/10061; G06T 2207/30148; G06T 7/0004; G06T 7/001; G06T 7/0042; H01L 22/12
See application file for complete search history.

(56) References Cited

U.S. PATENT DOCUMENTS 6,872,943 B2   3/2005  Takane et al.
6,987,873 B1 * 1/2006  Ben-Porath ............ G01N 21/88
                                                            257/E21.525
(Continued)

FOREIGN PATENT DOCUMENTS

JP        06-215139 A      8/1994
JP      2002-267441 A      9/2002
(Continued)

*Primary Examiner* — Mark Roz
(74) *Attorney, Agent, or Firm* — Miles & Stockbridge, P.C.

(57) ABSTRACT

It is an object of the present invention to provide a semiconductor inspection apparatus capable of well carrying out position alignment and correctly determining whether the position alignment has been carried out successfully or has ended in a failure without operator interventions even if an inspected image is an image having few characteristics as is the case with a repetitive pattern or the inspected image is an image having a complicated shape.
The semiconductor inspection apparatus includes means for imaging a shape on a wafer or on an exposure mask; means for storing an image inspected by the imaging means; means for storing design data of the semiconductor circuit corresponding to a position on the wafer or on the exposure mask which are to be imaged by the imaging means; means for storing a design-data image obtained as a result of converting the design data into an image; means for generating a design-data ROI image by converting an interest drawing region found from a relative crude-density relation of a shape included in the design-data image into an image; and a position alignment section configured to carry out position alignment on the inspected image and the design-data image. The semiconductor inspection apparatus makes use of the design-data ROI image in order to identify a position at which the inspected image and the design-data image match each other or compute the degree of coincidence.

12 Claims, 19 Drawing Sheets

(56) References Cited

U.S. PATENT DOCUMENTS

| | | |
|---|---|---|
| 7,235,782 B2 | 6/2007 | Takane et al. |
| 7,787,687 B2 | 8/2010 | Miyano et al. |
| 2005/0043903 A1* | 2/2005 | Nara .................. G06T 7/001 |
| | | 702/35 |
| 2007/0098249 A1 | 5/2007 | Miyano et al. |
| 2011/0110597 A1* | 5/2011 | Abe .................... G06K 9/6203 |
| | | 382/199 |
| 2012/0257041 A1* | 10/2012 | Nakagaki ............ H01J 37/28 |
| | | 348/80 |

FOREIGN PATENT DOCUMENTS

| | | |
|---|---|---|
| JP | 2007-121181 A | 5/2007 |
| JP | 2010-009437 A | 1/2010 |
| WO | WO 2010/114117 A1 | 10/2010 |

* cited by examiner

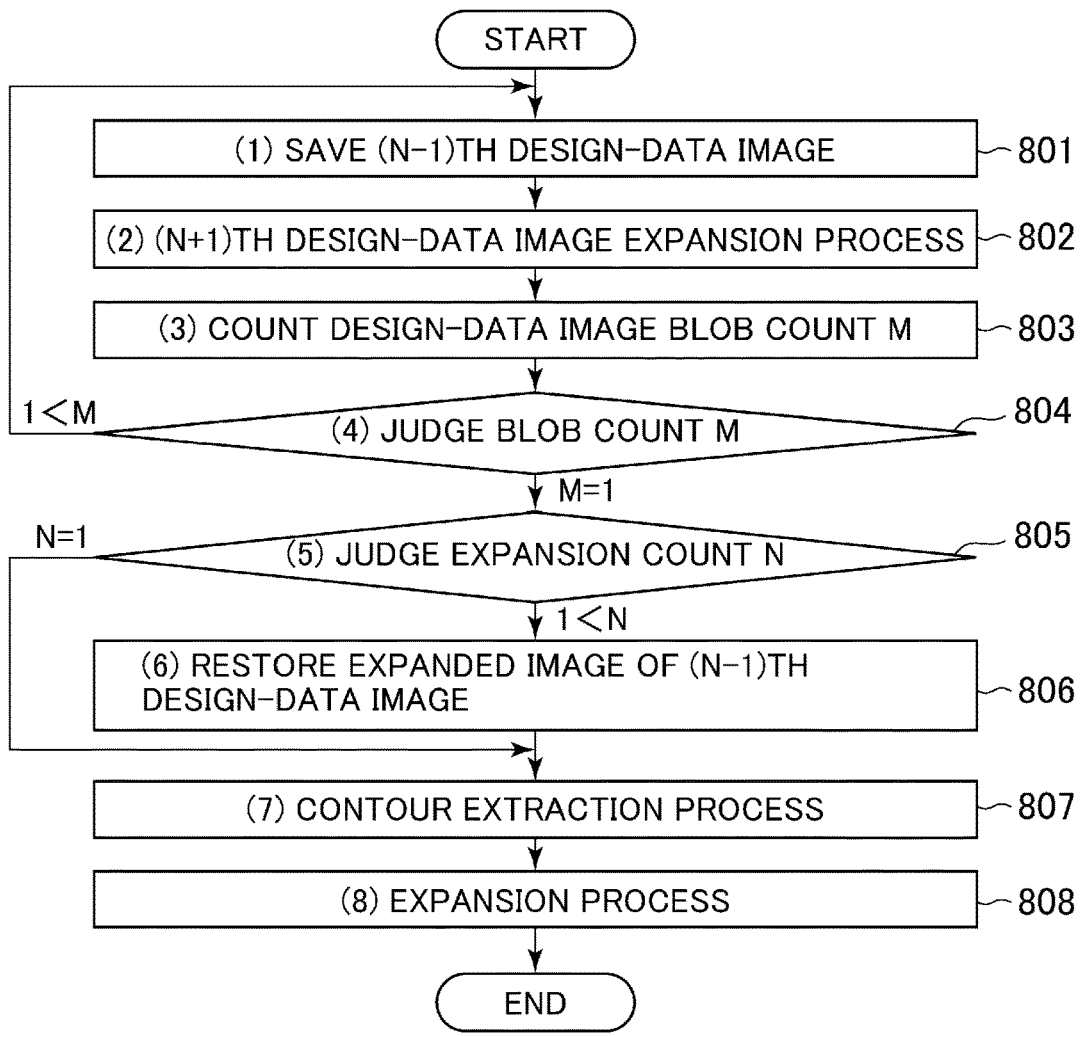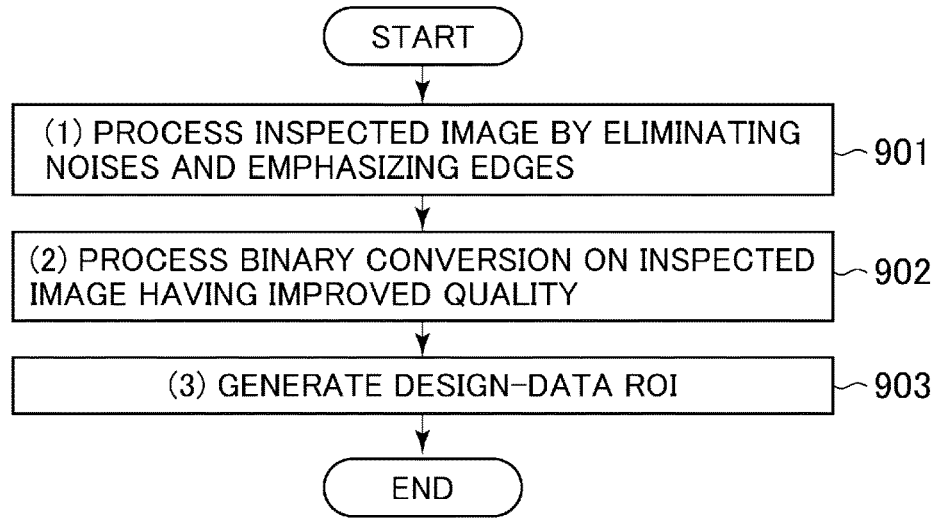

FIG. 17
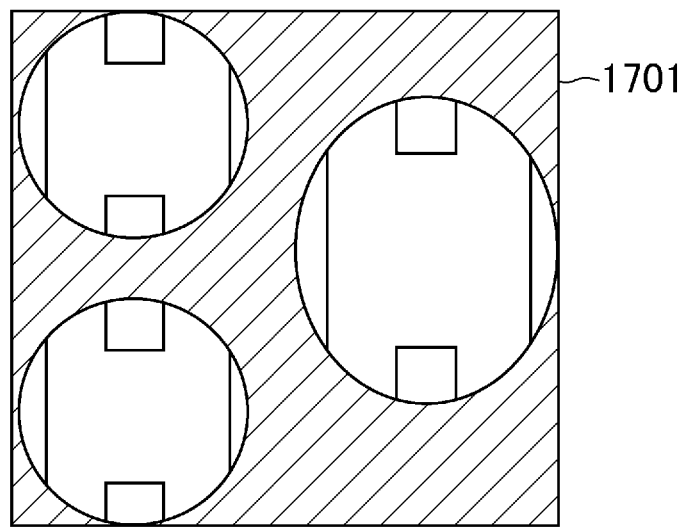
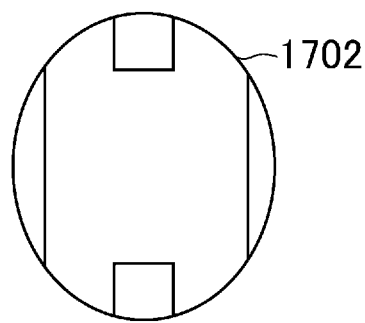

FIG. 18
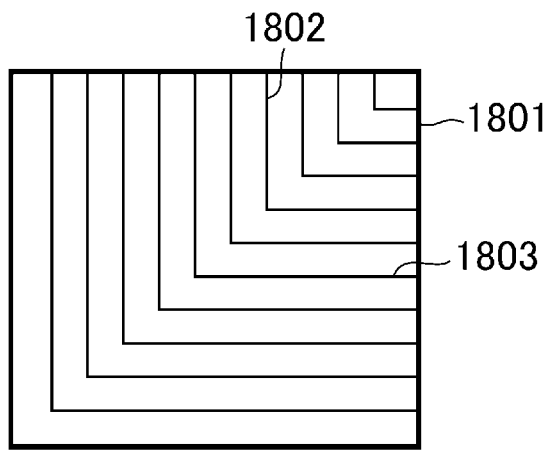
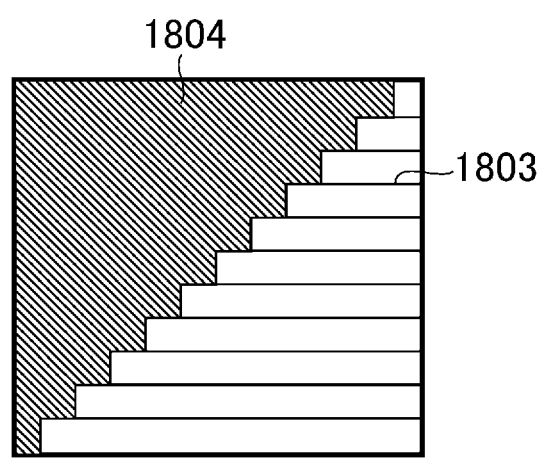
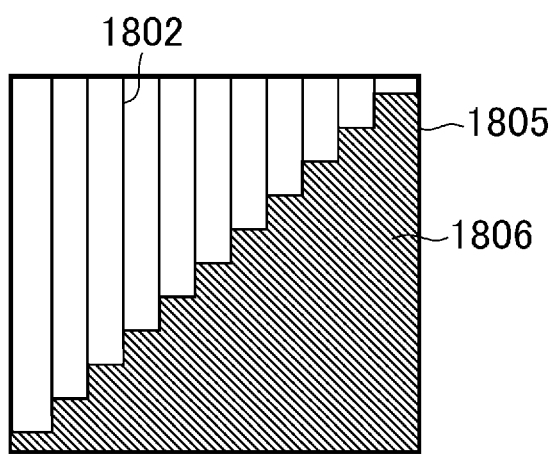
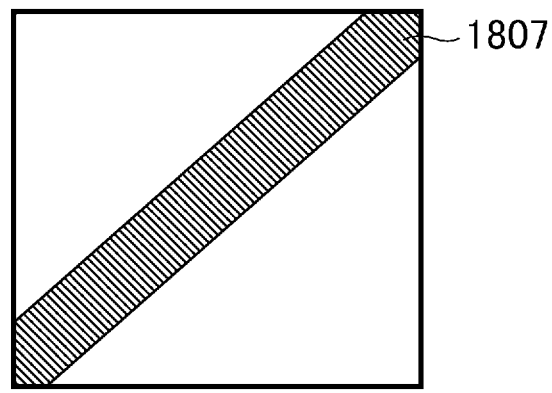
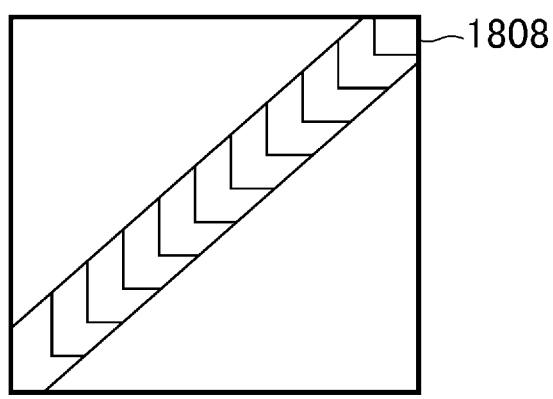

FIG. 21
(a)
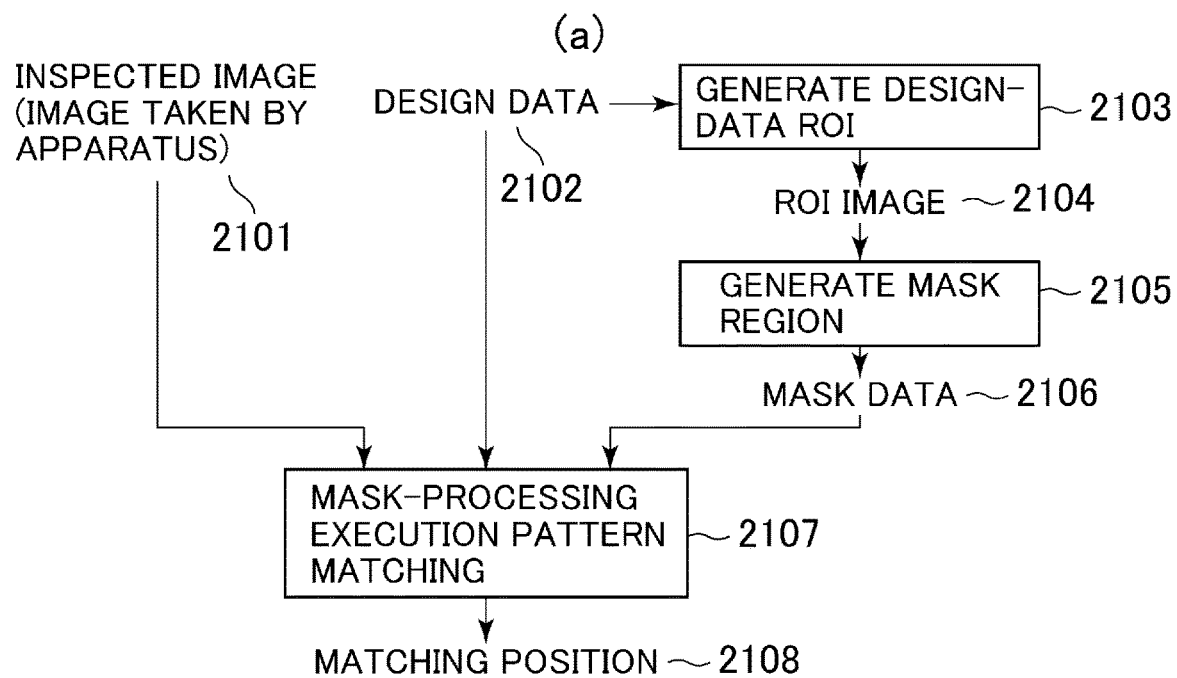
(b)
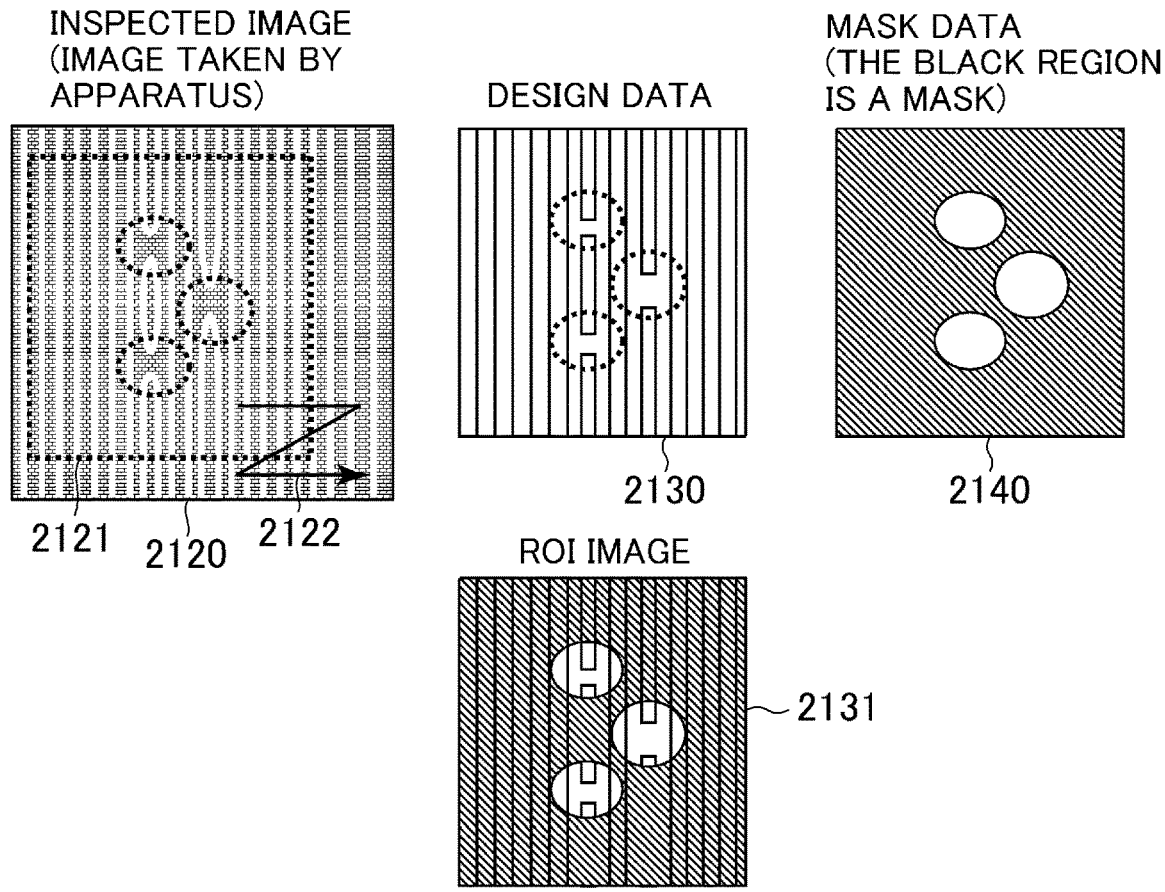

FIG. 23
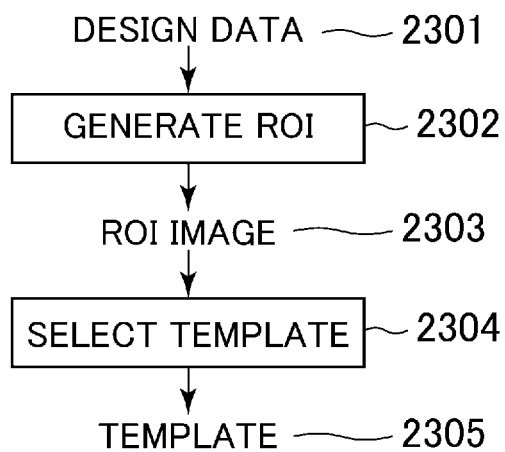
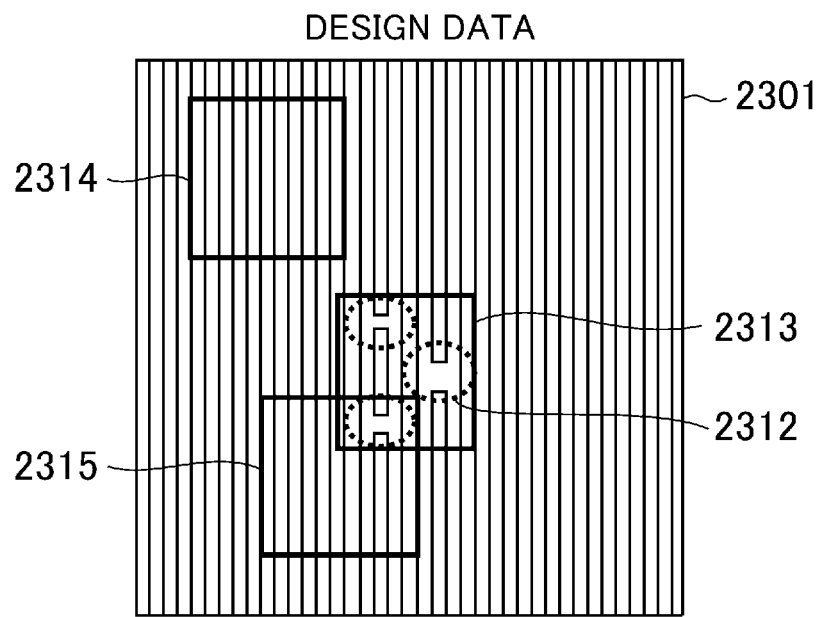

FIG. 24
(a)
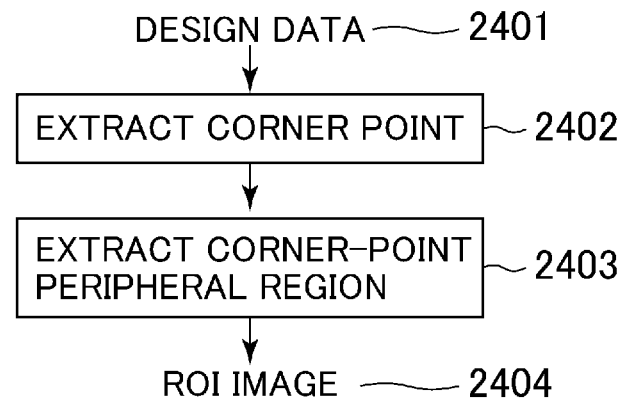
(b)
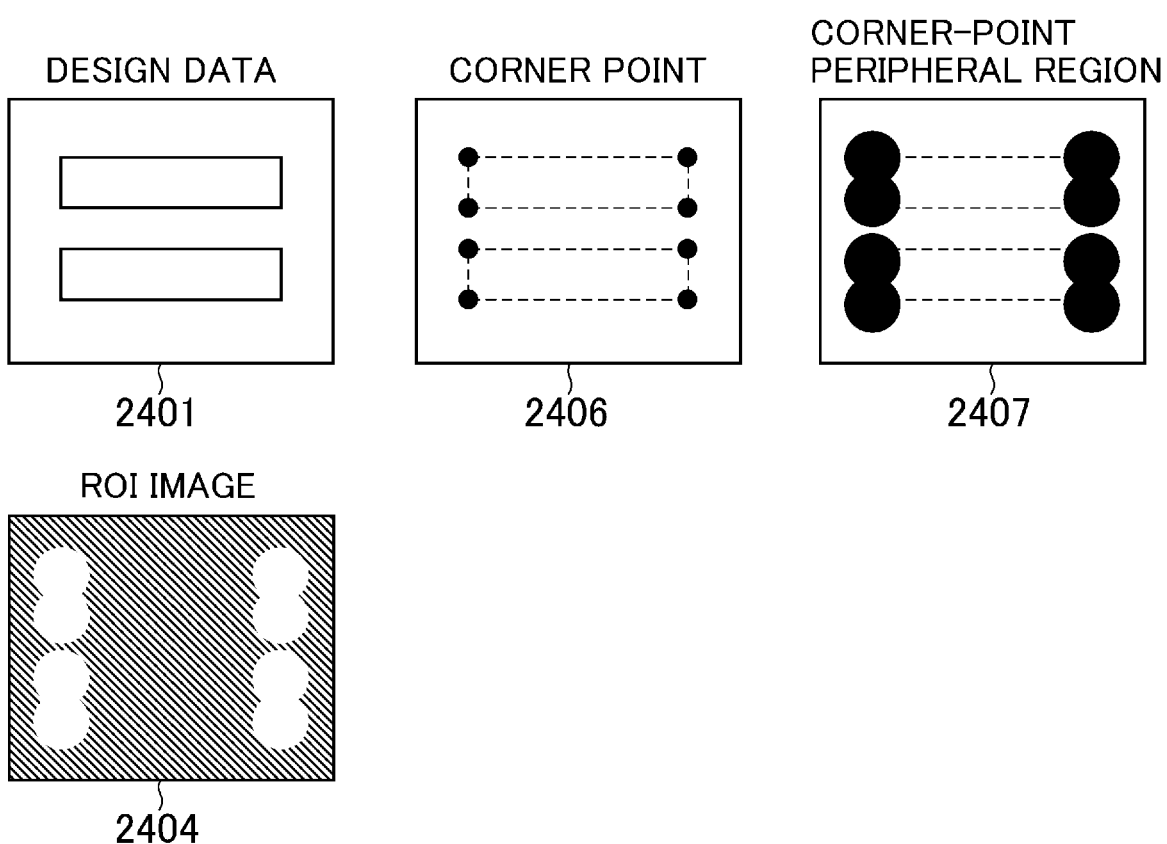

PATTERN MATCHING APPARATUS AND COMPUTER PROGRAM

TECHNICAL FIELD

The present invention relates to a pattern matching apparatus for carrying out pattern matching and a computer program to be executed by a computer in order to carry out the pattern matching. More particularly, the present invention relates to an apparatus for carrying out position alignment between an image obtained on the basis of design data and an image obtained on the basis of an imaging operation and relates to a computer program to be executed in order to carry out the position alignment.

BACKGROUND ART

As a technique for searching for a specific pattern existing on an object sample, a template matching method is known. More particularly, with semiconductor devices becoming finer and finer, a template matching method for carrying out position alignment of an image obtained by typically an SEM (Scanning Electron Microscope) for evaluating the semiconductor devices is required to provide better precision. Patent document 1 explains a process of creating a template on the basis of design data of a semiconductor device and a technique for carrying out pattern matching by making use of the template. In addition, patent document 2 discloses a technique for determining line portions (or protrusions) and space portions (or dents) in a pattern referred to as a line-and-space pattern in which lines are arranged at all but equal distances. Patent document 3 explains position alignment between design data including an additional evaluation region and a pattern image and a technique for evaluating the shape of a pattern, which is included in the additional evaluation region, after the position alignment.

PRIOR-ART LITERATURE

Patent Documents

Patent Document 1:
  JP-2007-5818-A (Corresponding to U.S. Pat. No. 7,235,782)
Patent Document 2:
  JP-2003-90719-A (Corresponding to U.S. Pat. No. 6,872,943)
Patent Document 3:
  JP-2007-121181-A (Corresponding to U.S. Pat. No. 7,787,687)

SUMMARY OF THE INVENTION

Problems to be Solved by the Invention

In accordance with the technique disclosed in patent document 3, an evaluation region can be set at a desired evaluation position. However, if there is a disagreement between design data and the shape of a pattern (or, strictly speaking, a real pattern) on an image obtained by an SEM or the like so that the pattern matching ends in a failure, the evaluation region is undesirably set at an incorrect position. In order to eliminate the disagreement between the design data and the shape of the real pattern, there is provided the technique disclosed in patent document 1. In accordance with this technique, smoothing processing is carried out on both the design data and the image of the real pattern in order to get rid of the difference in shape between the two. However, handling of a matching failure is still not disclosed.

In accordance with a pattern determination method like the one explained in patent document 2 as a method for a repetitive pattern, on the other hand, a line or space pattern can be identified to a certain degree. However, if side walls of a pattern are asymmetrical in the horizontal direction for example, there is conceivably a case in which a line or space pattern is identified incorrectly. In addition, the method disclosed in patent document 2 is a method for determining dents and protrusions. Thus, the method is not a method for carrying out pattern matching of periodical patterns used as the object of the method.

The following description explains a computer program and a pattern matching apparatus which are provided to have an objective to properly carry out matching even if determination of whether or not matching exists on an image including a repetitive pattern ends in a failure or even if a matching process ends in a failure.

Means for Solving the Problems

As an aspect to achieve the objective described above, as explained below, there is proposed a computer program to be executed by a computer in order to carry out pattern matching on an image by making use of a template created on the basis of design data or there is proposed a pattern matching apparatus for carrying out the pattern matching. The computer program or the pattern matching apparatus is used for determining whether or not image information included in a predetermined evaluation region is a predetermined condition after the pattern matching process.

In addition, as another aspect, there is proposed a computer program or a pattern matching apparatus. The computer program or the pattern matching apparatus is used for carrying out position alignment by comparing regions of interest (ROIs) with each other. The regions of interest are regions obtained by carrying out expansion processing on edge information obtained on the basis of design data and a pattern edge image obtained on the basis of a real image.

On top of that, as a further aspect, there its proposed a computer program or a pattern matching apparatus. The computer program or the pattern matching apparatus is used for carrying out pattern matching by making use of a template created as a result of mask processing of excluding an evaluation region.

Effects of the Invention

In accordance with the configurations described above, it is possible to determine whether or not matching has ended in a failure. Thus, an operator can be notified of the failure and, in addition, it is possible to carry out processing such as processing for eliminating the failure of the matching on the basis of the determination.

In addition, it is possible to carry out a proper matching process for an image including a repetitive pattern without depending on a difference in shape between two patterns.

BRIEF DESCRIPTION OF THE DRAWINGS

FIG. 8 is a flowchart representing a process of generating an ROI image on the basis of design data;

FIG. 9 is a flowchart representing a process of generating an ROI image on the basis of an imaging-result image (or an inspected image);

FIG. 17 is a diagram showing an example of a template making use of an ROI portion;

FIG. 18 is a diagram to be referred to in description of an example of an application in equal pattern gaps;

FIG. 21 is diagrams to be referred to in description of pattern matching making use of design data on which mask processing has been implemented;

FIG. 23 is diagrams to be referred to in description of automatic selection of a template region from design data;

FIG. 24 is diagrams showing an example of taking a region surrounding a corner of a pattern as an ROI;

MODES FOR CARRYING OUT THE INVENTION

With semiconductor devices becoming finer and finer, the possibility that the yield decreases and a defect is generated increases. The yield decreases and a defect is generated due to effects of, among others, dusts, temperature changes and vibrations.

Figure 1:
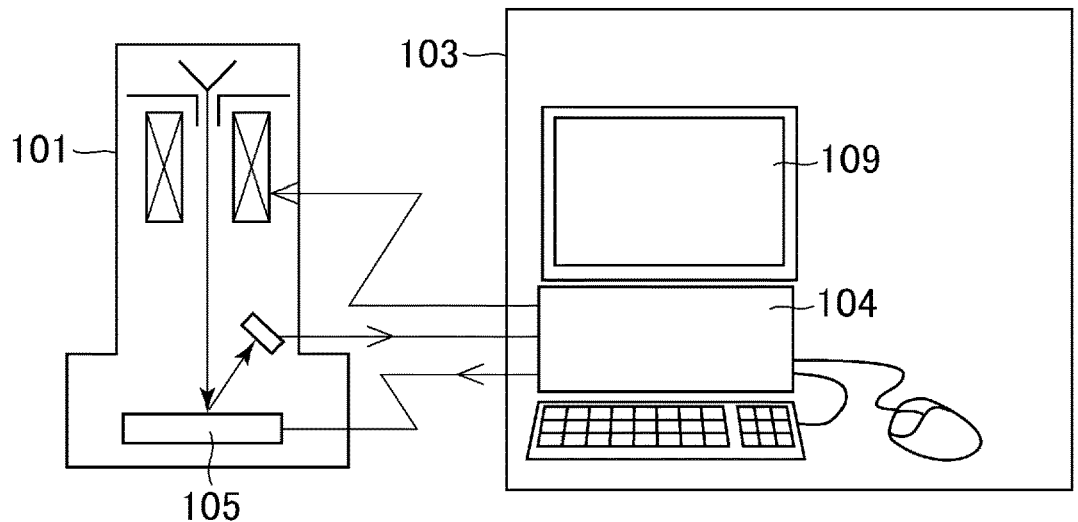
FIG. 1 is a diagram showing an example of a scanning electron microscope.

In addition, a long time of manufacturing a semiconductor circuit raises the manufacturing cost. Thus, there is a demand for reduction of time of intervention by the operator through automation of the inspection and measurement processes (which are referred to hereafter simply as inspection). FIG. 1 is a diagram showing an example of an inspection apparatus making use of an ordinary SEM.

The SEM includes mainly an electron-microscope mirror body 101 and a sample stage 105 which is put in a vacuum chamber. On the basis of an instruction issued by a computer 104 embedded in a control apparatus 103, in the SEM, a sample mounted on the sample stage 105 is scanned by making use of an electron beam and electrons emitted from a scanned area hit by the electron beam are detected by a detector. In addition, detected-electron signals are arranged synchronously with scan signals of the electron beam so as to create one-dimensional information (or a line profile) and a two-dimensional image. Then, the one-dimensional information and the two-dimensional image are displayed on a display unit 109.

Figure 13:
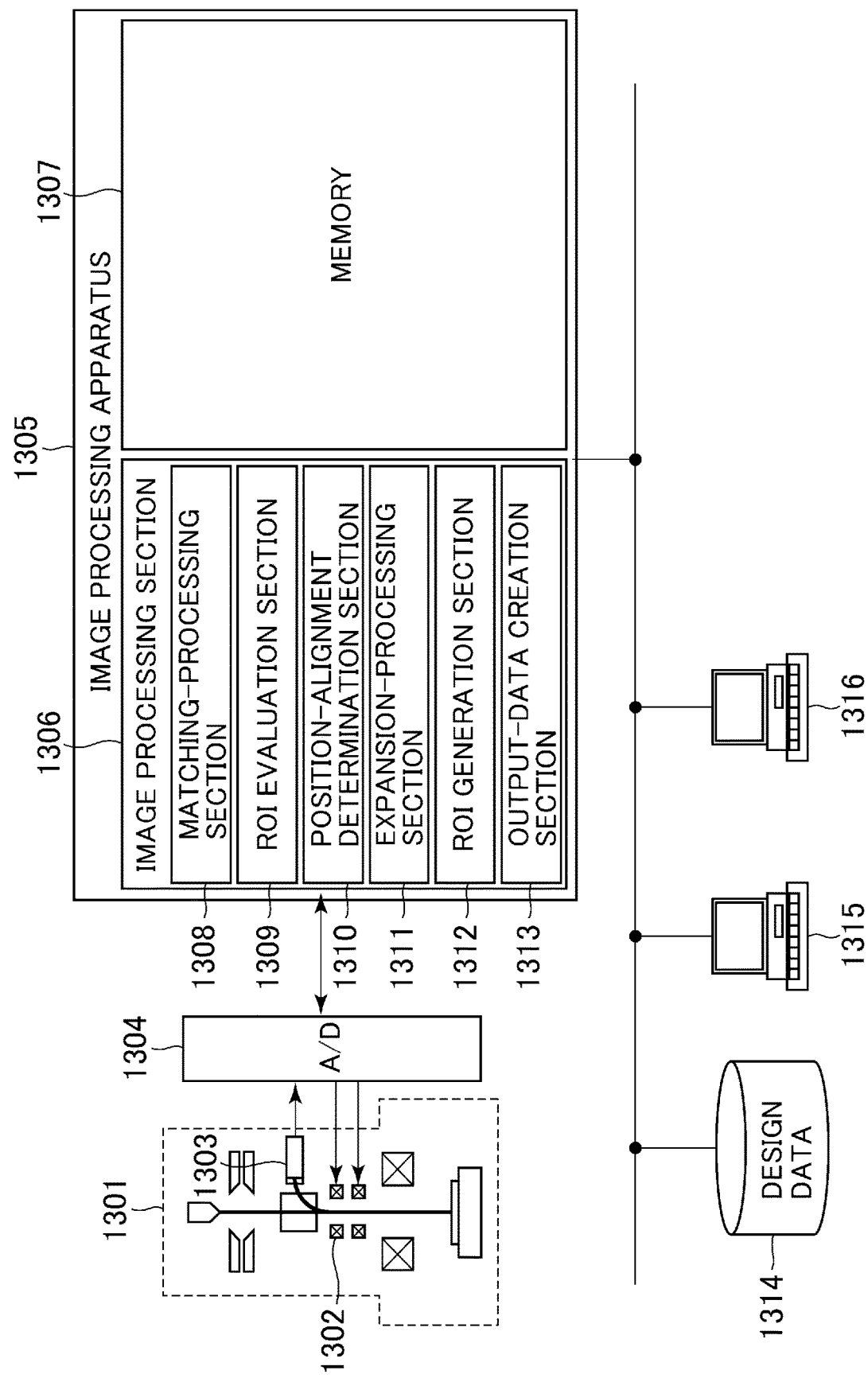
FIG. 13 is a diagram showing an example of a semiconductor measurement/inspection system including an SEM.

FIG. 13 is a diagram showing a measurement/inspection system including the SEM in more detail. The measurement/inspection system also has an SEM main unit 1301, an A/D converter 1304 and a control apparatus 1305 (which includes an image processing apparatus).

The SEM main unit 1301 radiates an electron beam to a sample such as a wafer on which electronic devices have been manufactured. Electrons emitted from the sample are caught by a detector 1303 and converted into a digital signal by the A/D converter 1304. The digital signal is supplied to the control apparatus 1305 and stored in a memory 1307. Image processing hardware embedded in an image processing section 1306 carries out image processing according to the purpose. The image processing hardware includes a CPU, an ASIC and an FPGA. In addition, the image processing section 1306 also has functions to create a line profile on the basis of the detected signal and measure a dimension between peaks of the profile.

The control apparatus 1305 is connected to an input apparatus 1315 having input means. The control apparatus 1305 also has functions such as a GUI (Graphical User Interface) function to display information to the operator on a display unit provided in an input apparatus 1108 or an external display unit 1109. The displayed information includes an image or a result of inspection.

It is to be noted that an electronic computer can be used for carrying out some or all of control of the control apparatus 1305 and some or all of processing of the control apparatus 1305. In this way, the control and the processing are delegated to the computer having a CPU and a memory which can be used for storing images. In addition, the input apparatus 1315 also functions as an imaging-recipe creation apparatus for creating an imaging recipe manually or by making use of design data stored in a design-data storing medium 1314 as the design data of the electronic devices. The imaging recipe includes electronic-device coordinates required in typically the inspection, a pattern matching template used in the position alignment and imaging conditions.

The input apparatus 1315 includes a template creation section configured to cut out a portion of a diagrammatic image created on the basis of design data and make use of the portion as a template. The created template is stored in the memory 1305 as a registered template of template matching in a matching processing section 1308 embedded in the image processing section 1306. The template matching is a technique for identifying a portion for which a template matches an imaging-result image serving as an object of the position alignment. The template matching is implemented on the basis of coincidence-degree determination adopting a normalized correlation technique or the like. The matching processing section 1308 identifies a desired position in the imaging-result image on the basis of the coincidence-degree determination.

In addition, the system shown in FIG. 13 also includes a simulator 1316. The simulator 1316 is an apparatus for inferring the performance of a pattern on the basis of design data stored in the design-data storing medium 1314.

In an embodiment to be explained below, pattern matching is carried out between edge information obtained mainly on the basis of design data and an imaging-result image obtained as a result of imaging carried out by making use of an SEM or the like. The edge information obtained mainly on the basis of design data is line-segment image information showing the ideal shape of a pattern created on the basis the design data and line-segment image information for which deformation processing to approach a real pattern has been carried out by making use of the simulator 1316. In addition, the design data is expressed for example in a GDS format or an OASIS format and stored in a form determined in advance. It is to be noted that software for displaying the design data is capable of displaying the design data in the format. Such software of any type can be used as long as the software is capable of handling the design data as figure data.

It is to be noted that, in the embodiment to be explained below, a control apparatus mounted on the SEM or a control apparatus (or the input apparatus 1315) connected to the SEM by a communication line or the like is used as a typical control apparatus. However, the used control apparatus is by no means limited to such a control apparatus. For example, a general-purpose processing apparatus can also be used for executing a computer program to carry out image processing so as to perform processing like one to be described later. In addition, a technique to be described later can also be applied to another charged particle radiation apparatus such as an FIB (Focused Ion Beam) apparatus.

The embodiments described below relate to an apparatus for carrying out pattern matching, a program to be executed by a computer in order to carry out the pattern matching and a storage medium used for storing the program.

First Embodiment

If the inspected image includes a repetitive pattern such as a line-and-space pattern having about the same line and space widths, it is quite within the bounds of possibility that position alignment based on pattern matching is not carried out properly. This is because, even if the position alignment has been carried out with a shift of one pitch in an image wherein the same pattern is enumerated, the coincidence degree approximately equivalent to an accurate position will be inevitably resulted in. In the case of an image including a pattern having few characteristics as described above or an image including a pattern having a complicated shape, if the ordinary matching method is adopted, the position alignment may end in a failure. As a result, the operation of the measurement/inspection system is stopped or delayed so that the time required by the operator to carry out an operation increases. In addition, it is also difficult to correctly determine whether or not the position alignment has ended in a failure.

By referring to diagrams, the following description of the embodiment explains an apparatus capable of easily determining whether or not matching has been carried out successfully. By carrying out such determination quickly, a temporary and early recovery from a matching error can be performed and a proper template condition to be applied at a recipe setting time can be discovered early. Thus, the automation rate of the apparatus can be improved. In addition, on the basis of detection of a matching error, different matching processes can be carried out selectively so that improvement of the efficiency of the matching process can be implemented.

The embodiment explained below implements an apparatus or a system. The apparatus or the system includes: imaging means for imaging a shape on a wafer or on an exposure mask which are both used mainly in manufacturing of a semiconductor integrated circuit; means for storing an image inspected by the imaging means; means for storing design data of the semiconductor integrated circuit corresponding to a position on the wafer or on the exposure mask which are to be imaged by the imaging means; means for storing a design-data image obtained as a result of converting the design data into an image; means for generating a design-data ROI image by converting an interest drawing region found from a relative crude-density relation of a shape included in the design-data image into an image; and a position alignment section configured to carry out position alignment on the inspected image and the design-data image. The apparatus or the system makes use of the design-data ROI image in order to identify a position at which the inspected image and the design-data image match each other or compute a coincidence degree. The embodiment also implements a computer program to be executed by a computer in order to carry out the processing described above.

In accordance with the configuration described above, the design-data ROI image generated from the design data of the semiconductor integrated circuit is used in order to pay attention to only a characteristic region excluding a region having a high shape density. Thus, even if the position alignment is a little bit incorrect, a difference in coincidence degree between the design data and the inspected image can be output.

For example, if the inspected image has a repetitive pattern shape with a periodical misalignment, the design data in the ROI and the inspected image are usually different from each other. It is thus possible to correctly determine whether a correct solution of the position alignment has been obtained or the position alignment has ended in a failure.

In addition, if an inspected-image ROI image is generated from the inspected image, only regions other than the repetitive pattern image are left. Thus, the periodical misalignment is hardly generated. As a result, the number of failing position alignments is reduced and it is possible to correctly determine whether a correct solution of the position alignment has been obtained or the position alignment has ended in a failure.

Since it is possible to correctly determine whether a correct solution of the position alignment has been obtained or the position alignment has ended in a failure, it is possible to present an operator-free semiconductor inspection apparatus.

By referring to diagrams, the following description explains details of an apparatus for determining whether matching has been carried out successfully or has ended in a failure on the basis of selective evaluation inside an image. It is to be noted that, in each of the diagrams, the same sections are each denoted by the same reference numeral in order to avoid duplications of explanations.

Figure 2:
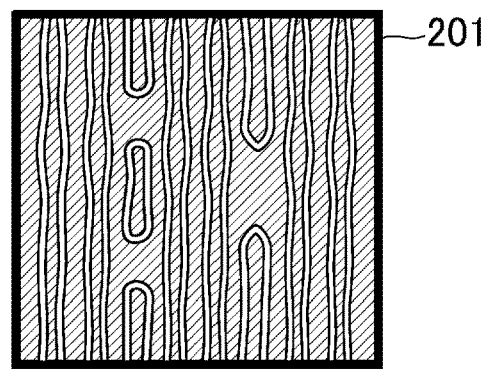
FIG. 2 is a diagram showing an example of a measurement or inspection object image including a repetitive pattern.
Figure 3:
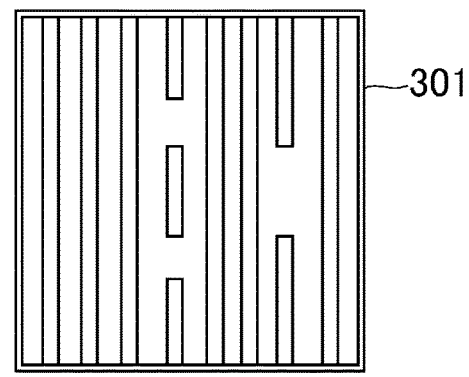
FIG. 3 is an explanatory diagram showing an example of a diagrammatic image created on the basis of design data including a repetitive pattern.
Figure 4:
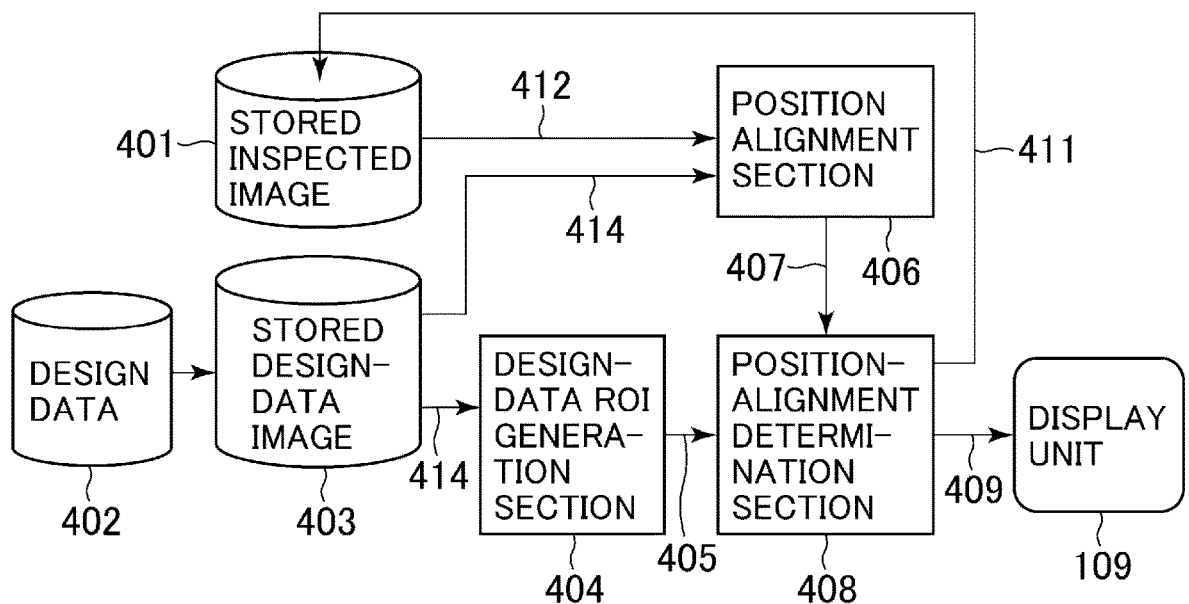
FIG. 4 is a block diagram to be referred to in description of a position alignment determination process.
Figure 5:
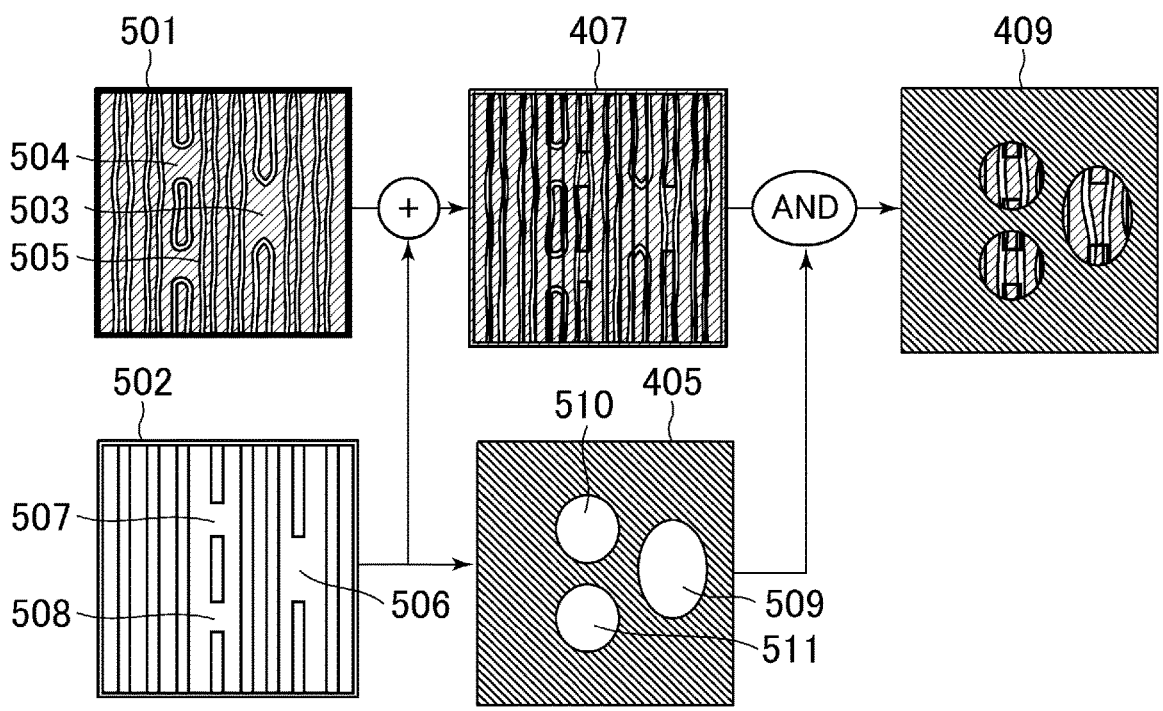
FIG. 5 is a diagram to be referred to in description of a process of carrying out position alignment determination on the basis of selective evaluation of an ROI of a position-alignment object image.

FIG. 4 is a diagram to be referred to in description of an example of a position alignment determination process. FIG. 2 is a diagram showing an imaging-result image used as an object of pattern matching. FIG. 3 is an explanatory diagram showing a template image created on the basis of design data. FIG. 5 is a diagram to be referred to in description of a matching process between two images.

Design data 402 shown in FIG. 4 is data stored in a design-data storing medium 1314 shown in FIG. 13. At a template creation time, the design data 402 is stored temporarily in a memory 1307 inside the control apparatus 1305 (as a design-data image 403). The following description explains an example of creating a template on the basis of the design-data image. It is to be noted, however, that a template can also be created on the basis of a simulation image generated in a simulator 1316. The memory 1307 is also used for storing an imaging-result image (also referred to as an inspected image) serving as an object of pattern matching. (The imaging-result image is stored in the memory 1307 as an inspected image 401). The inspected image 401 is supplied to a matching process carried out by a matching processing section 1308.

The inspected image 412 and the design-data image 414 are subjected to position alignment carried out by a position-alignment section 406. On the other hand, a design-data ROI generation section 404 creates a design-data ROI image 405 on the basis of the design-data image 414.

A position-alignment result 407 and the design-data ROI image 405 are supplied to a position-alignment determination section 408.

The position-alignment result 407 is determined by the position-alignment determination section 408 by paying attention to an ROI of the design-data ROI image 405 in order to compute a coincidence degree 409. The position-alignment determination section 408 is the same as a position-alignment determination section 1310 shown in FIG. 13. The position-alignment coincidence degree 409 obtained on the basis of the position alignment determination is displayed on a display unit 109. It is to be noted that, as the position-alignment coincidence degree 409, it is also possible to make use of a generally known correlation value or the like.

The position-alignment coincidence degree 409 is supplied to the display unit 109 to be displayed thereon along with the inspected image 412, the design-data image 414 and the design-data ROI image 405. In addition, if the position-alignment coincidence degree 409 indicates a failure, an imaging re-execution request 411 is transmitted to the inspected image 401. Then, an inspected image 412 obtained by re-execution of the imaging is used for carrying out the position alignment again.

In this embodiment, as shown in FIG. 5, the design-data ROI image 405 is generated on the basis of the design-data image 502 and the design-data ROI image 405 is used to determine whether the position alignment carried out on the inspected image 501 and the design-data image 502 has been completed successfully or has ended in a failure. In order to determine whether or not correct position alignment has been carried out on the inspected image 501 and the design-data image 502 which are shown in FIG. 5, at least, it suffices to determine whether or not correct position alignment has been carried out at least on a characteristic region 503 in an inspected image and the characteristic region 506 of the design-data image. This embodiment implements an example in which characteristic regions 507 and 508 on the design-data image 502 as well as characteristic regions 504 and 505 of the inspected image 501 are also used as objects of determination.

The design data includes a periodical pattern. If the design data includes a portion in which the periodicity is interrupted and proper position alignment was not performed by carrying out matching, the characteristic region 503 becomes the periodical pattern on the inspected image 503 letting the characteristic region 503 be subjected to the position alignment. In comparison with a case in which the entire inspected image 501 is compared with the entire design-data image 502, this portion is a portion for which the coincidence degree seen at a matching-error time becomes relatively lower (or the non-coincidence degree becomes relatively higher). That is to say, in the region, the difference in coincidence degree between successful matching and failing matching is striking. If this portion is selectively evaluated, it is possible to accurately verify whether the matching has been carried out successfully or the matching has ended in a failure.

In this embodiment, the design-data image 502 is supplied to the design-data ROI generation section 404 for generating a design-data ROI image 405. In the design-data ROI image 405, ROIs 509, 510 and 511 corresponding to those denoted by reference numerals 506, 507 and 508 respectively are generated. The design-data ROI generation section 404 corresponds to an ROI generation section 1312 shown in FIG. 13 and generates an ROI on the basis of typically expansion processing to be described later. A position-alignment result 407 is an image obtained by synthesizing the inspected image 501 and the design-data image 502 on the basis of results of the position alignment.

Then, the position-alignment result 407 and the design-data ROI image 405 are subjected to a logical-multiply (AND) operation carried out by the position-alignment determination section 408 in order to generate a position-alignment determination result 409. In this case, a ratio of the edge information of an inspected image 501 included in the position-alignment determination result 409 to the design information of the design-data image 502 is found in order to determine whether the position alignment has been carried out successfully or has ended in a failure.

Figure 14:
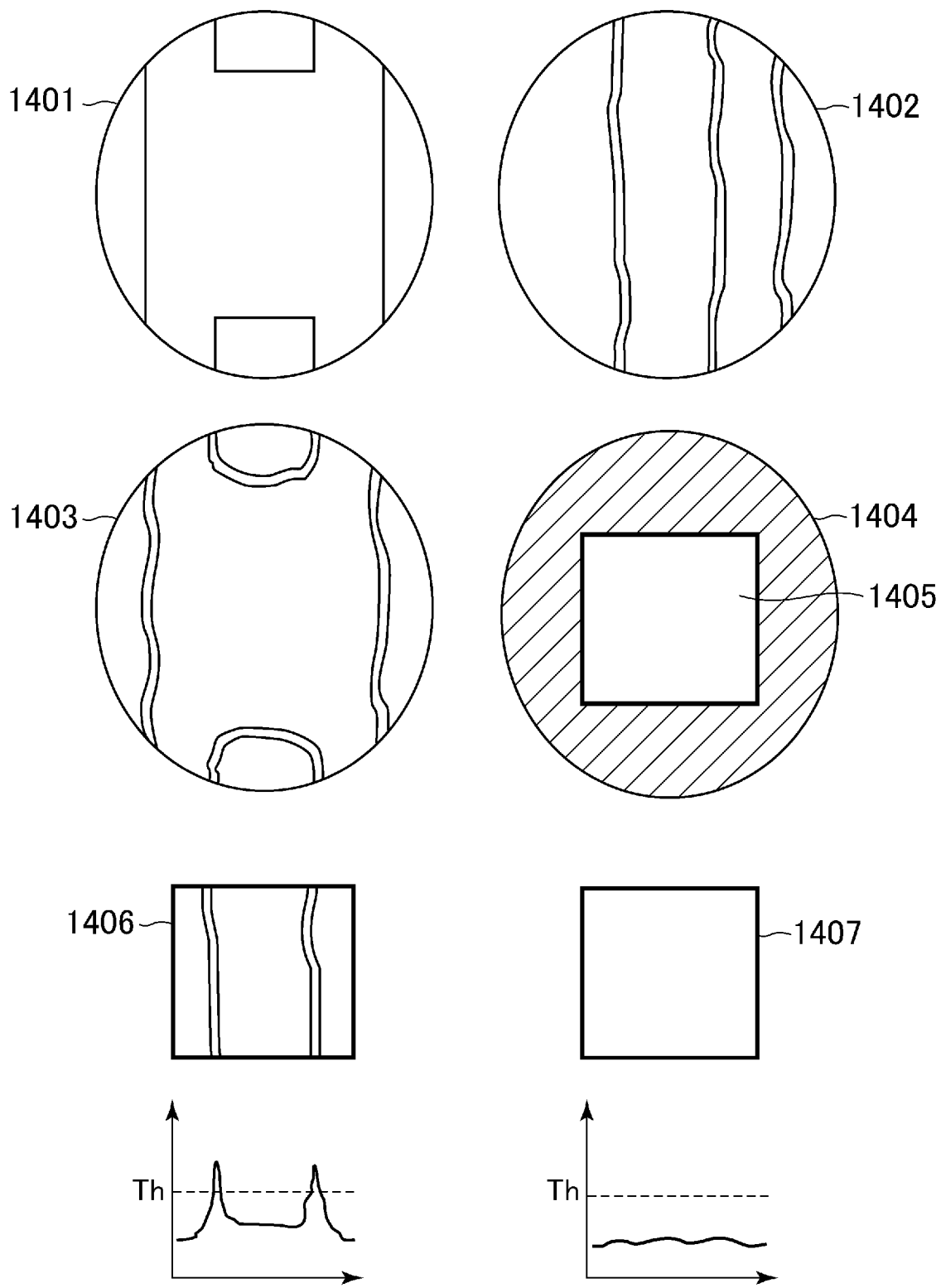
FIG. 14 is a diagram showing examples of a line-segment image created on the basis of design data included in an ROI (Region of Interest) and an image of a real pattern.

In addition, on the basis of a procedure like one described below, an ROI evaluation section 1309 is also capable of determining whether the position alignment has been carried out successfully or has ended in a failure. FIG. 14 shows an evaluation region (ROI) 1401 obtained on the basis of design data, an imaging-result image region 1402 which is superposed on the evaluation region 1401 when the matching has ended in a failure and an imaging-result image region 1403 which is superposed on the evaluation region 1401 when the matching has been carried out successfully.

In this case, if the difference between the imaging-result image region 1402 and the imaging-result image region 1403 is known, it is possible to determine whether the matching has been carried out successfully or the matching has ended in a failure on order to determine whether the matching has been carried out successfully or the matching has ended in a failure on the basis of a pixel ratio as described above, it is necessary to find the ratio of the number of pixels included in the evaluation region 1401 as pixels each having a luminance determined in advance to the number of all pixels included in the entire evaluation region 1401. If the ratio satisfies a condition such as a value determined in advance, it is determined that the matching has been carried out successfully. Otherwise, it is determined that the matching has ended a failure. (For example, if the ratio is in a ratio range determined in advance, the matching is determined to have been carried out successfully. If the ratio is outside the ratio range, on the other hand, the matching is determined to have ended in a failure). In addition, it is also possible to determine whether the matching has been carried out successfully or the matching has ended in a failure on the basis of comparison of the absolute value of the number of pixels with a threshold value instead of comparing such a relative ratio with a ratio range. On top of that, it is also possible to determine whether the position alignment has been carried out successfully or the position alignment has ended in a failure on the basis of comparison of the degree of coincidence between design data inside an evaluation region merely having a size smaller than the size of the entire template and an imaging-result image with a threshold value.

In addition, a profile waveform may be created inside an evaluation window 1405 provided inside an evaluation region 1404. In this case, it is possible to determine that e matching has ended in a failure if a peak exceeding a threshold value determined in advance is detected as is the case with an evaluation window 1406 and it is possible to determine that the matching has been carried out successfully if no peak exceeding the threshold value is detected as is the case with an evaluation window 1407.

Figure 15:
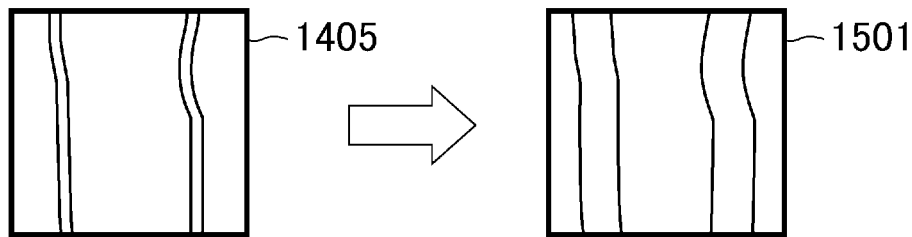
FIG. 15 is a diagram to be referred to in description of an example of processing of expansion to an image of a real pattern.

On top of that, as shown in FIG. 15, for the evaluation window 1405, if the number of pixels is counted after expansion processing of the edge portions has been carried out, it is possible to better clarify a predetermined pixel-count difference based on determination of whether or not the edge portions exist in the evaluation window 1405.

A result of the determination of whether the matching has been carried out successfully or the matching has ended in a failure as described above is displayed on the display unit 109 as a position-alignment determination result 409 in order to notify the operator that the position alignment has been carried out successfully or the position alignment has ended in a failure.

By referring to FIG. 8, the following description explains a process carried out by the design-data ROI generation section 404 (or the ROI generation section 1312) to generate a design-data ROI image 405.

The process represented by a flowchart shown in the figure firstly saves a design-data image 502 in a memory 1307 as an (N−1)th image (step 801). Then, at step 802, an expansion-processing section 1311 carries out expansion processing in order to perform a process of thickening a line serving as the contour of a pattern. At this step, an expansion processing count N is incremented by 1. The expansion processing is carried out, for example, as follows. If pixels adjacent to an interest drawing pixel include at least one pixel corresponding to an edge, the gradation of the interest drawing pixel is set at the same level as the edge.

Then, at step 803, from an image generated at step 802, the number of regions (blobs) other than a region having its luminance changed by the expansion processing is counted. The number of such regions is referred to as a region count M. Then, the region count M is compared with 1. If the region count M is found greater than 1, the flow of the process goes back to steps 801 to 803 (step 804). As a matter of fact, steps 801 to 804 are carried out repeatedly till the region count M is found equal to 1 at step 804. As the region count M is found equal to 1 (M=1), the flow of the process goes on to step 805.

At step 805, the expansion count N is compared with 1. If the expansion count N is found equal to 1 (N=1), the flow of the process goes on to step 807. If the expansion processing count is found equal to or greater than 2, on the other hand, the flow of the process goes on to step 806. At step 806, an expanded image is returned so that the (N−1)th image is used as the object of processing carried out at the next step.

At step 807, an unpainted portion is extracted. Then, at step 808, the image is subjected to correction processing to typically expand the image so that the unpainted portion has a position and a size which are proper when used as an ROI (Region Of Interest). Subsequently, at this step, a result of the correction processing is output.

Figure 12:
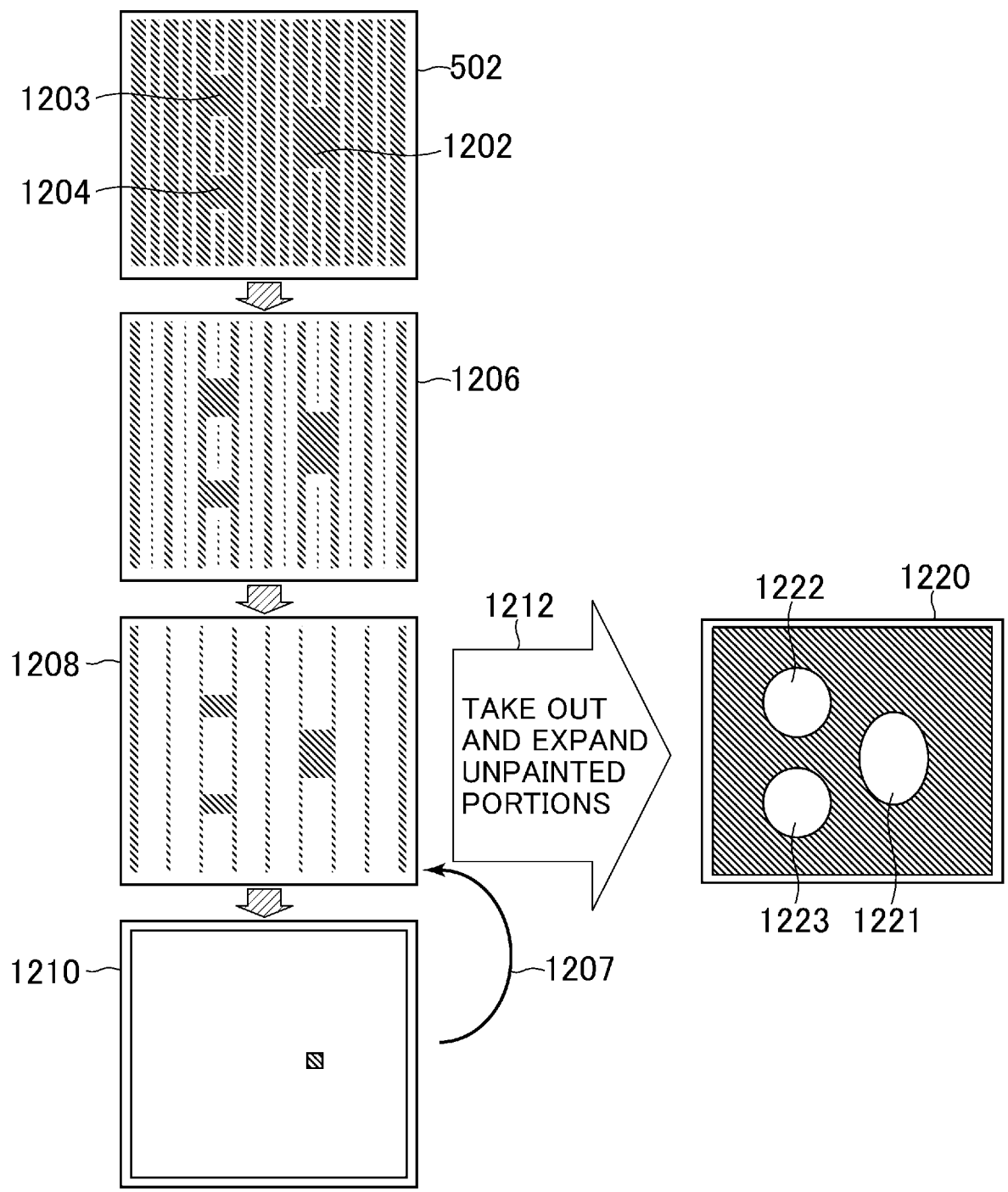
FIG. 12 is a flowchart representing a process of generating an ROI image on the basis of design data.

FIG. 12 is a diagram to be referred to in the following description of a process of extracting an ROI on the basis of the expansion processing. An ROI generation section 1312 extracts an ROI by making use of an image for which the expansion processing has been carried out by the expansion-processing section 1311. An input design-data image 502 is assumed to include characteristic points 1202, 1203 and 1204 serving as characteristic positions. If the design-data image 502 is subjected to expansion processing, the number of white portions increases as shown by an image 1206. In addition, if the image 1206 is subjected to expansion processing again, an image 1208 is obtained. On top of that, if the image 1208 is subjected to expansion processing again, an image 1210 is obtained.

The number of unpainted regions (blobs) not subjected to painting processing in the image 1210 is one. Since the design-data image 502 has been subjected to expansion processing at least two times, processing 1212 is carried out to take out a shape from the image 1208 used as the (N−1)th image. Then, if processing such as the expansion processing is carried out, an ROI (Region Of Interest) image 1220 is obtained.

The ROI (Region Of Interest) image 1220 includes a white region 1221 corresponding to the characteristic point 1202, a white region 1222 corresponding to the characteristic point 1203 and a white region 1223 corresponding to the characteristic point 1204.

Figure 11:
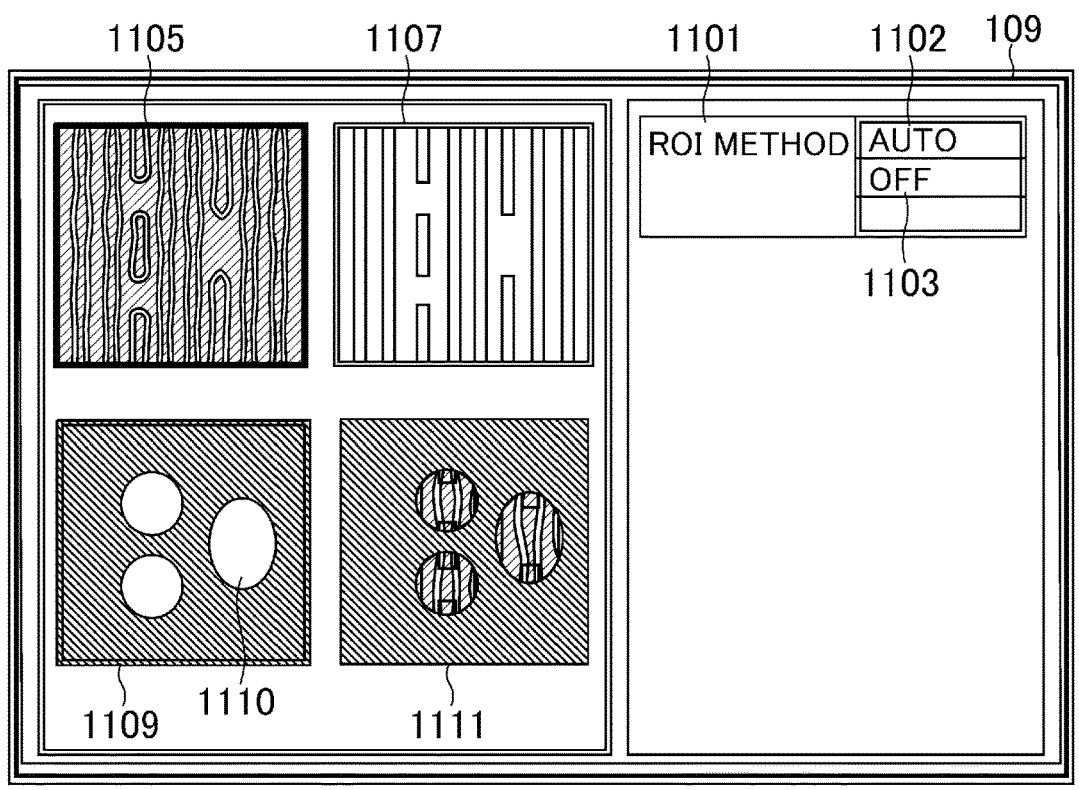
FIG. 11 is a diagram showing an example of a display screen displaying results of position alignment processing.

Since information remaining at the end of the expansion processing is used as an ROI (Region Of Interest), it is possible to find the ROI (Region Of Interest) from a relative crude-density relation of a shape instead of determining the shape included in design data, FIG. 11 is a diagram showing an example of a display screen of the display unit 109 displaying results of position alignment processing. The displayed data is data created by an output-data creation section 1313 shown in FIG. 13. A menu 1101 is an ROI method switch for specifying whether or not an ROI (Region Of Interest) is to be found. An Auto switch 1102 is used for specifying that an ROI is to be found automatically by making use of a processing flow shown in FIG. 8.

If an ROI (Region Of Interest) is not used, an OFF switch 1103 is specified. A window 1105 displays an inspected image whereas a window 1107 displays a design-data image. A window 1109 is an ROI display portion for displaying a design-data ROI image 405 generated by a design-data ROI generation section 404.

A window 1111 is a result display portion for displaying a result of the position alignment. That is to say, the window 1111 displays a position-alignment determination result 409. In addition, the window 1111 may also display synthesized images on 1105, 1107 and 1109. When the operator is looking at the window 1111, the operator is capable of knowing which region in a design-data image displayed on 1107 is being determined.

Figure 16:
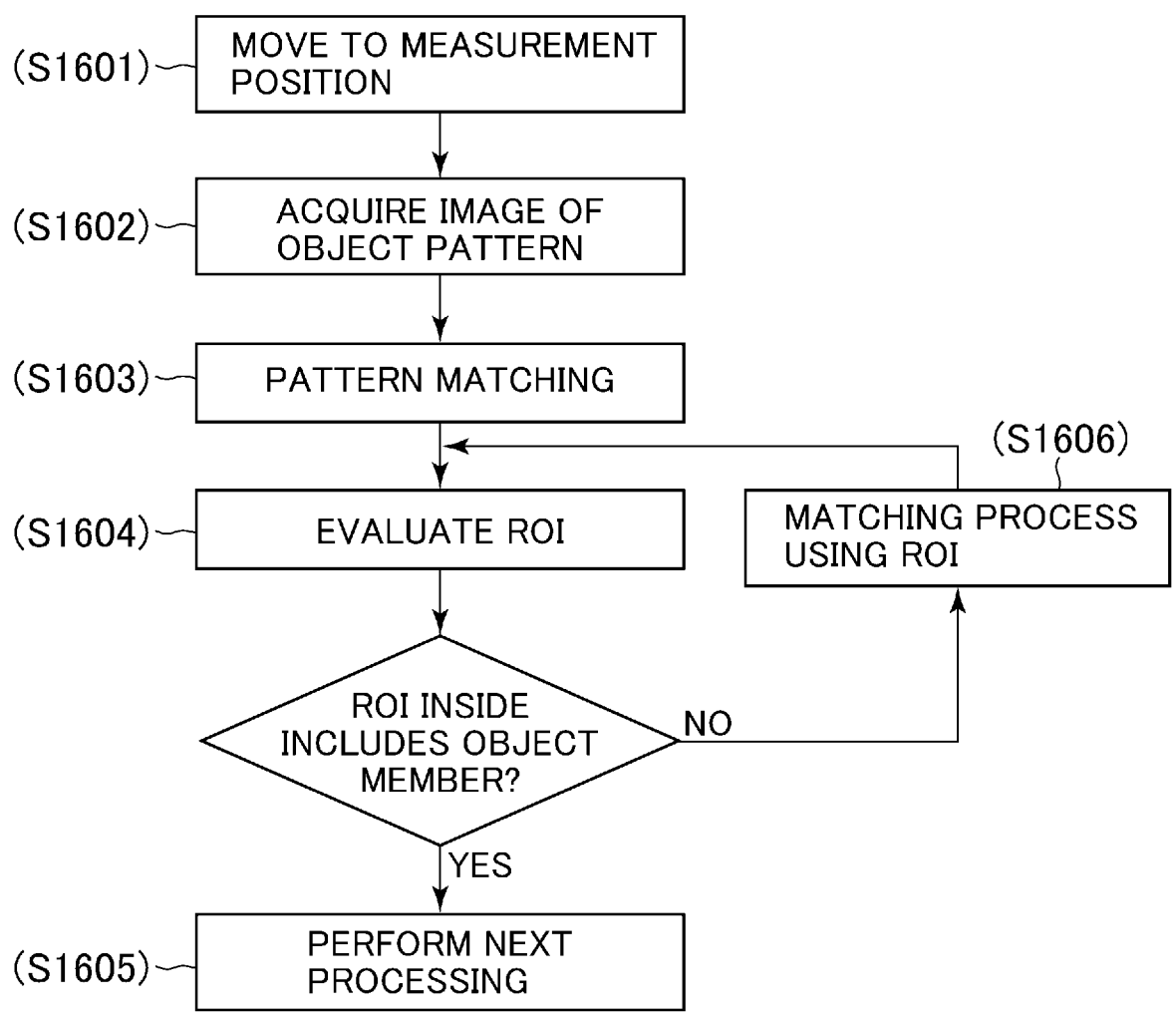
FIG. 16 is a flowchart representing a process of pattern matching and evaluation of the matching.

The example described above explains a sequence of operations ending with determination of whether the position alignment has been carried out successfully or the position alignment has ended in a failure. FIG. 16 shows a flowchart representing an example of carrying out the position alignment processing again on the basis of determination that the position alignment has ended in a failure. As shown in the figure, a measurement-object position is set in a region radiated by an electron beam (step 1601). Then, the image of an object pattern is acquired on the basis of electron-beam scanning (step 1602). Then, pattern matching is carried out by making use of a template like the design-data image 502 (step 1603). After the template matching, evaluation of the inside of an ROI is carried out in order to determine whether or not an object member (such as an interrupted portion of a periodical pattern) is included in the ROI. If an object member is included in the ROI, the position alignment processing carries out the next processing (such as beam scanning for a measurement) (step 1605). If no object member is included in the ROI, that is, if the position alignment is determined to have ended in a failure, on the other hand, the flow of the position alignment processing carries out correct position alignment by performing a matching process making use of the ROI (step 1606). If a close correct position is determined to exist even though the position alignment is determined to have ended in a failure, as shown in FIG. 17, a matching process in a narrow range is carried out by making use of a selected region 1701 including three ROIs and a template composed of one ROI 1702. In this case, for example, the movement range of the template is limited to three pitches of a line-and-space pattern. (That is to say, a range which is narrow in comparison with the movement distance of the template in the first template matching is searched.) In this way, the processing can be carried out at a higher speed and with a high degree of efficiency.

Second Embodiment

Figure 6:
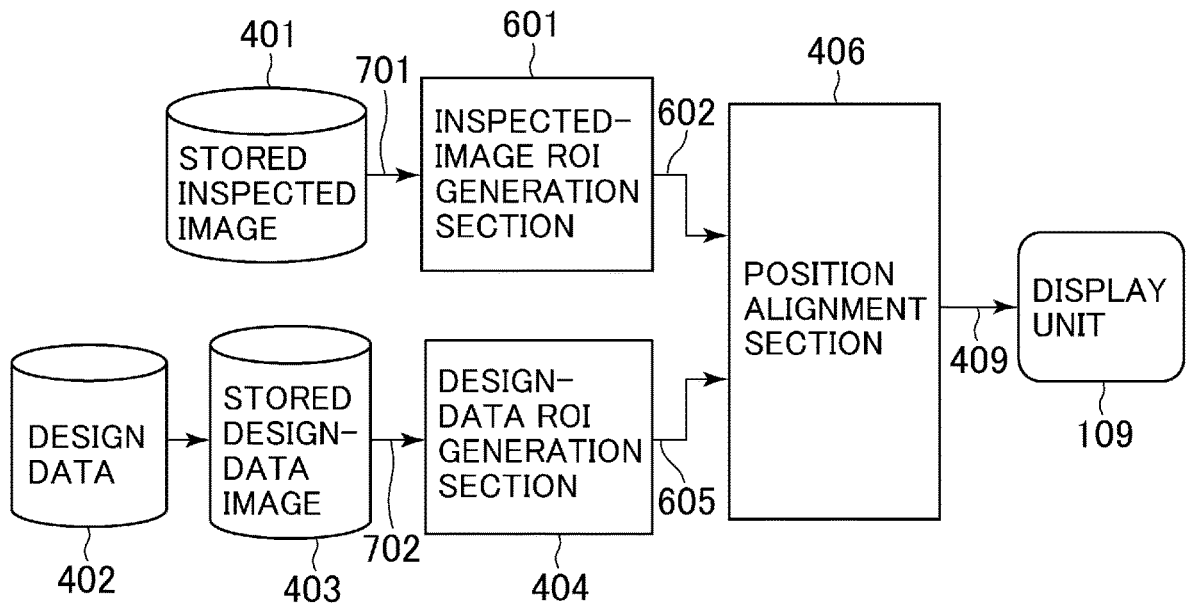
FIG. 6 is a diagram to be referred to in description of a process of carrying out position alignment on the basis of comparison of an ROI generated on the basis of design data with an ROI generated on the basis of an imaging-result image.
Figure 7:
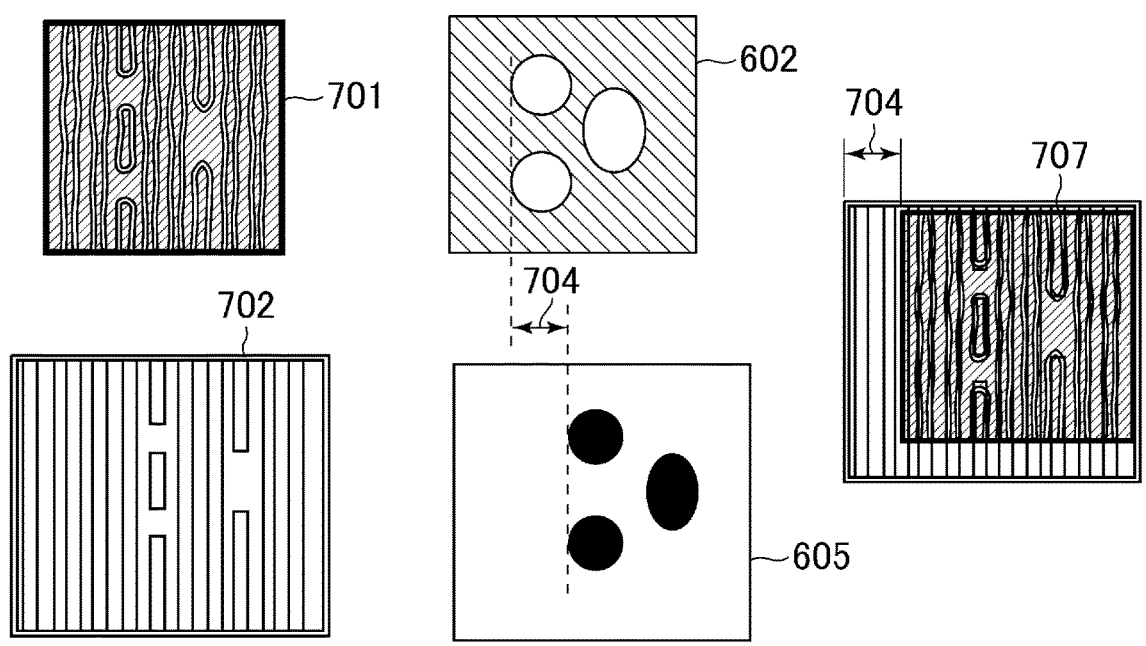
FIG. 7 is a diagram showing examples of images used when carrying out position alignment on the basis of comparison of an ROI generated on the basis of design data with an ROI generated on the basis of an imaging-result image.

FIG. 6 is a block diagram showing a configuration for carrying out a matching process to compare ROI regions of image data generated on the basis of design data and image data generated on the basis of an imaging-result image with each other by carrying out expansion processing on both of the image data. On the other hand, FIG. 7 is a diagram showing examples of both the pieces of aforementioned image data and an example of an image from which an ROI has been extracted.

In this embodiment, both an inspected image 701 and a design-data image 702 are stored in a memory 1307. In addition, an inspected-image ROI generation section 601 and a design-data ROI generation section 404 generate an ROI. (In the case of the configuration shown in FIG. 13, both the inspected-image ROI generation section 601 and the design-data ROI generation section 404 are an ROI generation section 1312).

A position-alignment section 406 receives an inspected-image ROI image 602 and a design-data ROI image 605, carrying out position alignment on them by adopting a generally known method such as a normalized correlation technique or the like. In addition, if a matching processing section 1308 carries out matching processing for example, the contours of ROIs are extracted so that the matching processing section 1308 is capable of carrying out the matching processing by comparing the contours of the ROI shapes with each other instead of comparing pattern shapes on the sample with each other. In this case, a relative movement distance minimizing a difference between the contours of the ROI shapes is defined as a movement distance required for the matching. In accordance with such a configuration, it is possible to reduce the possibility of a matching error based on a disagreement between the shape of the design data and the shape of the real pattern.

On the basis of a position at which the inspected-image ROI image 602 and the design-data ROI image 605 match with each other, an output-data creation section 1313 is capable of generating positional-error information 704 of both the inspected-image ROI image 602 and the design-data ROI image 605 as a position-alignment result 409 and displaying the information on the display unit 109. The output-data creation section 1313 creates output data for displaying information on the success/failure of the matching and the positional-error information. The display unit 109 displays the information on the success/failure of the matching and the positional-error information along with additional information including the name of a recipe, an image acquisition time and coordinates of the sample.

In addition, on the basis of the positional-error information, a position-alignment result 704 completing position correction can be displayed on the display unit 109.

FIG. 9 is a flowchart representing a process carried out by an inspected-image ROI generation section 601 to generate an ROI image. The flowchart shown in FIG. 9 is different from the flowchart shown in FIG. 8 in that information to be input to the flow of processing of FIG. 8 is created from an inspected image. The flowchart shown in FIG. 9 begins with step 901 at which image processing such as elimination of noises and emphasizing of edges is carried out for an inspected image 701 in order to improve the quality of the image. Such image processing is carried out by an image processing section 1306. Then, at step 902, the inspected image having an improved quality is converted into a binary image. In the subsequent processing, in accordance with the same procedure as the flowchart shown in FIG. 8, an ROI (Region Of Interest) is found from the inspected image in order to generate an inspected-image ROI image 602.

Third Embodiment

Figure 10:
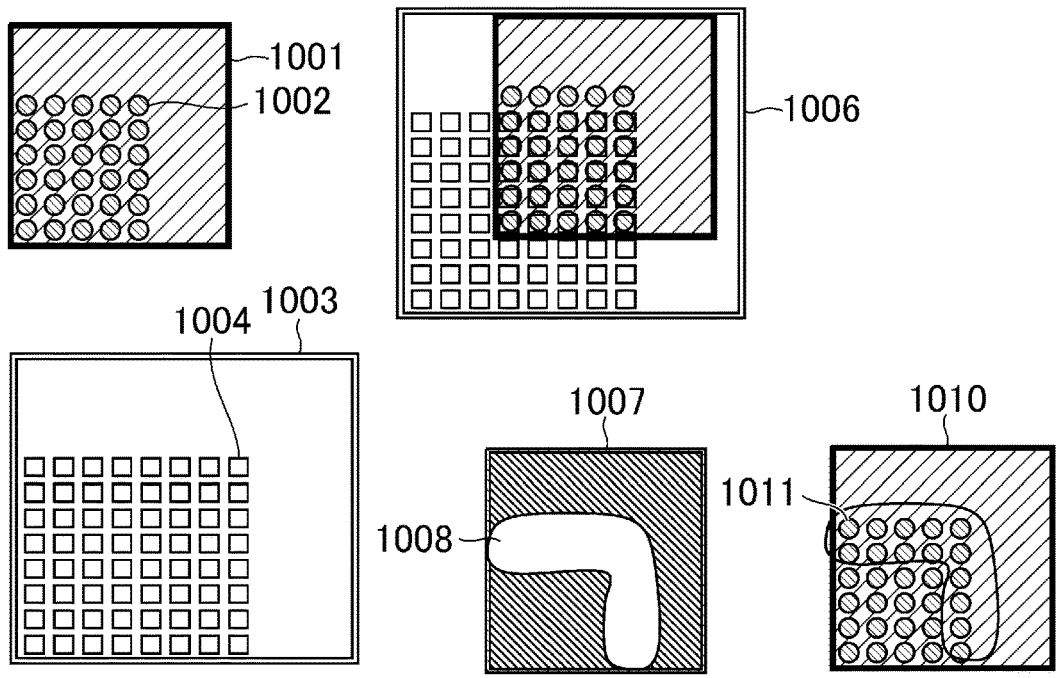
FIG. 10 is a diagram showing examples of images which are used when position alignment processing for an image obtained as a result of imaging of a hole array is carried out.

FIG. 10 is a diagram to be referred to in the following description of matching processing which is carried out with a hole array taken as an object image. The hole array is a form of a repetitive pattern.

In the position alignment carried out between an inspected image 1001 and a design-data image 1003, it is desirable to superpose holes 1002 of the inspected image 1001 on holes 1004 of the design-data image 1003.

Since the shape of the hole array forms a repetitive pattern, however, a shift of one row of the hole array or one column of the hole array may be generated.

In the case of a shift of one row or one column, the degree of coincidence can be expressed by a simple formula of Eq. 1 in which notation B denotes the total number of holes in the inspected image 1001 whereas notation A denotes the number of holes representing inspected-image holes not superposed on the design-data image holes. In the case of a failure image 1005 shown in FIG. 10, A is 5 whereas B is 30. Thus, from the simple formula of Eq. 1, the degree of coincidence is found to be 83%.

$$\text{Degree of coincidence} = 1 - (A/B) \times 100 [\%] \qquad (\text{Eq. 1})$$

In this case, the degree of coincidence only for the inside of the ROI is found. As a concrete step, first of all, on the basis of a result of the position alignment, a design-data image is cut out in order to generate a design-data ROI image 1007. An ROI 1008 is included in the design-data ROI image 1007. The ROI 1008 superposed on a position-alignment result 1006 is a coincidence-degree computation image 1010. If Eq. 1 is used for a coincidence-degree computation image 1011, the hole count A is 5 whereas the hole count B is 9 so that the degree of coincidence is 44%. As is obvious from the above description, by making use of a design-data ROI, it is possible to determine the success/failure of the position alignment with a high degree of precision.

The pattern matching method and the pattern matching verification method which are described above can be applied to a pattern inspection apparatus, a length measurement apparatus and a semiconductor measurement/inspection system which are particularly used for inspecting the wafer of semiconductor devices and a circuit pattern of an exposure mask.

Fourth Embodiment

FIG. 18 is a diagram showing examples of design-data images having patterns based on design data and composed of horizontal and vertical line segments separated from each other by equal distances. In order to determine that a kink portion is a characteristic region from a design-data image 1801, a longitudinal-pattern component 1802 is expanded selectively in the left and right directions till the longitudinal-pattern component 1802 overlaps adjacent patterns on the left and right sides. The boundary between a transversal-pattern component 1803 and the expanded region 1804 of the longitudinal-pattern component 1802 becomes a crude-density relation of the patterns and a characteristic region 1807 is obtained. As an alternative, in order to determine that a kink portion is a characteristic region from a design-data image 1801, a transversal-pattern component 1803 is expanded selectively in the upward and downward directions till the transversal-pattern component 1803 overlaps adjacent patterns on the upper and lower sides. The boundary between the longitudinal-pattern component 1802 and the expanded region 1806 of the transversal-pattern component 1803 becomes a crude-density relation of the patterns and a characteristic region 1807 is obtained. By making use of a region of the characteristic region 1807 in execution of matching from the design-data image 1801, the matching can be carried out with a high degree of precision.

Fifth Embodiment

Figure 19:
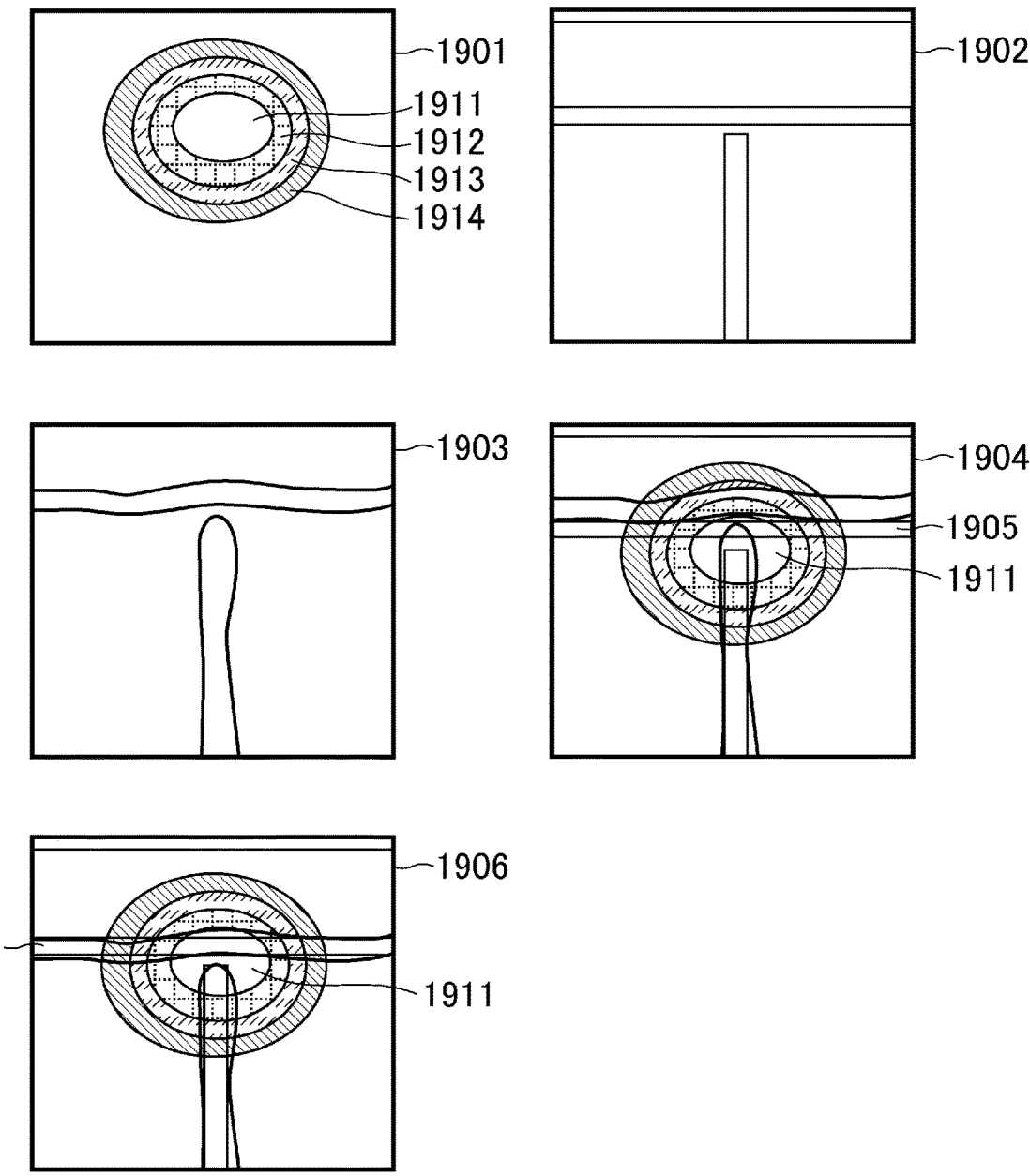
FIG. 19 is a diagram to be referred to in description of an example of matching making use of a grey scale ROI.

FIG. 19 is a diagram to be referred to in the following description of an example of carrying out weighted matching by making use of a design-data ROI at a grey scale. An image showing the design-data ROI is not a black/white binary image. Instead, a grey-scale design-data ROI 1901 can be used as the image showing the design-data ROI. In the case of the grey-scale design-data ROI 1901, a pixel value at a grey scale means a weight of a matching correct position. Matching the center of the grey-scale design-data ROI 1901 is expected. Regions 1911, 1912, 1913 and 1914 each having equal pixel values have pixel values increasing in a direction from the periphery of the grey-scale design-data ROI 1901 to the center of the grey-scale design-data ROI 1901. For example, in the case of a matching-failure result image 1904 of matching of a design-data image 1902 and an imaging result SEM image 1903, the matching position is shifted in the upward direction by the width of a horizontal pattern 1905. In the case of a matching-success result image 1906 of matching of the design-data image 1902 and the imaging result SEM image 1903, on the other hand. The pattern of the design data and the edge of the SEM image overlap each other. In order to determine whether or not the matching position of either the 1904 or the 1906 is correct, a pixel at which the pattern of the design data and the edge of the SEM image overlap each other is taken as a plus point whereas a disagreement pixel is taken as a minus point the 1904 and the 1906. In addition, a product of the pixel values of the 1911, 1912, 1913 and 1914 in which pixels exist is computed. The degree to which the pattern of the design data and the edge of the SEM image overlap each other is multiplied by the pixel value of the grey-scale design-data ROI 1901 to give a score. Then, the one having the highest score is taken as a matching correct position. In this way, the number of matching failures can be reduced.

Sixth Embodiment

FIG. 21 is explanatory diagrams to be referred to in the following description of a method for taking the region of a design-data ROI as a selection region in which the degree of similarity between an inspected image and design data is evaluated in a method for carrying out pattern matching between the inspected image and the design data. In this case, a region in which the degree of similarity between inspected image and design data is not evaluated is referred to as a mask processing region. A matching method in which the degree of similarity between an inspected image and design data is not evaluated in the mask processing region is referred to as a mask-processing execution pattern matching method.

By adoption of this method, a region in which the degree of similarity is evaluated by carrying out pattern matching can be limited to a design-data ROI which is a characteristic region in an image so that the robustness of the matching can be enhanced. (A reason as to why the robustness of the matching can be enhanced will be described later). FIG. 21(*a*) shows processing flows of this method. Mask-processing execution pattern matching 2107 receives an inspected image 2101, design data 2102 and mask data 2106, outputting a matching position 2108. It is to be noted that the mask data 2106 is generated in the following processing. First of all, on the basis of design data, an ROI image 2104 is generated by design-data ROI generation processing 2103 explained earlier by referring to FIG. 8. Then, on the basis of the generated ROI image 2104, mask-region generation processing 2105 is carried out to generate mask data.

In the processing described above, mask-processing execution pattern matching making use of a design data ROI can be carried out. FIG. 21(b) is an explanatory diagram showing, among others, an image generated by carrying out the mask-processing execution pattern matching. In the pattern matching, in an inspected image 2120, a region having the same size as design data used as a template for the matching processing is cut out and the degree of similarity between the cut-out region and the design data is evaluated. The position of the cut-out region is moved over the inspected image (as shown by an arrow 2122). The degree of similarity between the cut-out region and every position is evaluated. The position having the highest degree of similarity is taken as a matching position.

In this embodiment, the matching correct position is a dashed-line portion 2121. In addition, a round dashed-line portion on the inspected image 2120 is a characteristic region of the image. (Other regions form a repetitive pattern which is a line-and-space pattern). The characteristic region in the design data 2130 is the round dashed-line portion of the design data 2130. This region can be extracted by adoption of the ROI generation method explained earlier by referring to FIG. 8. The extracted region is a region shown as a white round region in an ROI image 2131. (The design data in the region is drawn only for a reference purpose in order to show the location of the region. In actuality, however, such design data does not exist).

In a mask region generation section, the ROI of a ROI image is subjected to the mask-processing execution pattern matching processing in order to append a flag of typically 1 indicating that the degree of similarity. As for other regions (that is, mask regions), a flag of typically 0 is appended to indicate that the degree of similarity is not to be carried out. As described before, the matching processing receives an inspected image 2120, design data 2130 and mask data 2140. By making use of the mask data 2140, it is possible to carry out evaluation making use of only a characteristic region in the design data in the evaluation of the degree of similarity to the inspected image.

By adoption of this method, the robustness of the matching can be enhanced because of the following reason. For example, with the similarity degree evaluation region including a large number of regions of a line-and-space repetitive pattern (with the ratio of the line width to the space width set at 1:1) which is a non-characteristic pattern as is the case with the inspected image 2120, depending on the condition of the creation of the semiconductor pattern, if the width of the line is equal to the width of the space rather than lines (or spaces) between the inspected image and the design data, due to a bad effect of the line-and-space pattern occupying most of similarity-degree evaluation regions, the matching position is shifted by for example half a pitch so that it is feared that the matching will undesirably end in a failure. If the degree of similarity is evaluated by limitation to the characteristic region of a round dashed-line portion as described above, on the other hand, the matching can be prevented from ending in a failure due to such a half-pitch shift. Thus, the matching can be carried out robustly.

It is to be noted that the value of the flag of the mask region is not limited to the binary value. As described before by referring to FIG. 19, the flag of the mask region can also have a grey-scale value (or a multi value). In this case, if the similarity-degree evaluation of the pattern matching is calculation of a correlation for example, a grey-scale (multi-value) weight can be used as a multiplier to serve as a rate of contribution to the correlation value of every pixel.

Seventh Embodiment

Figure 22:
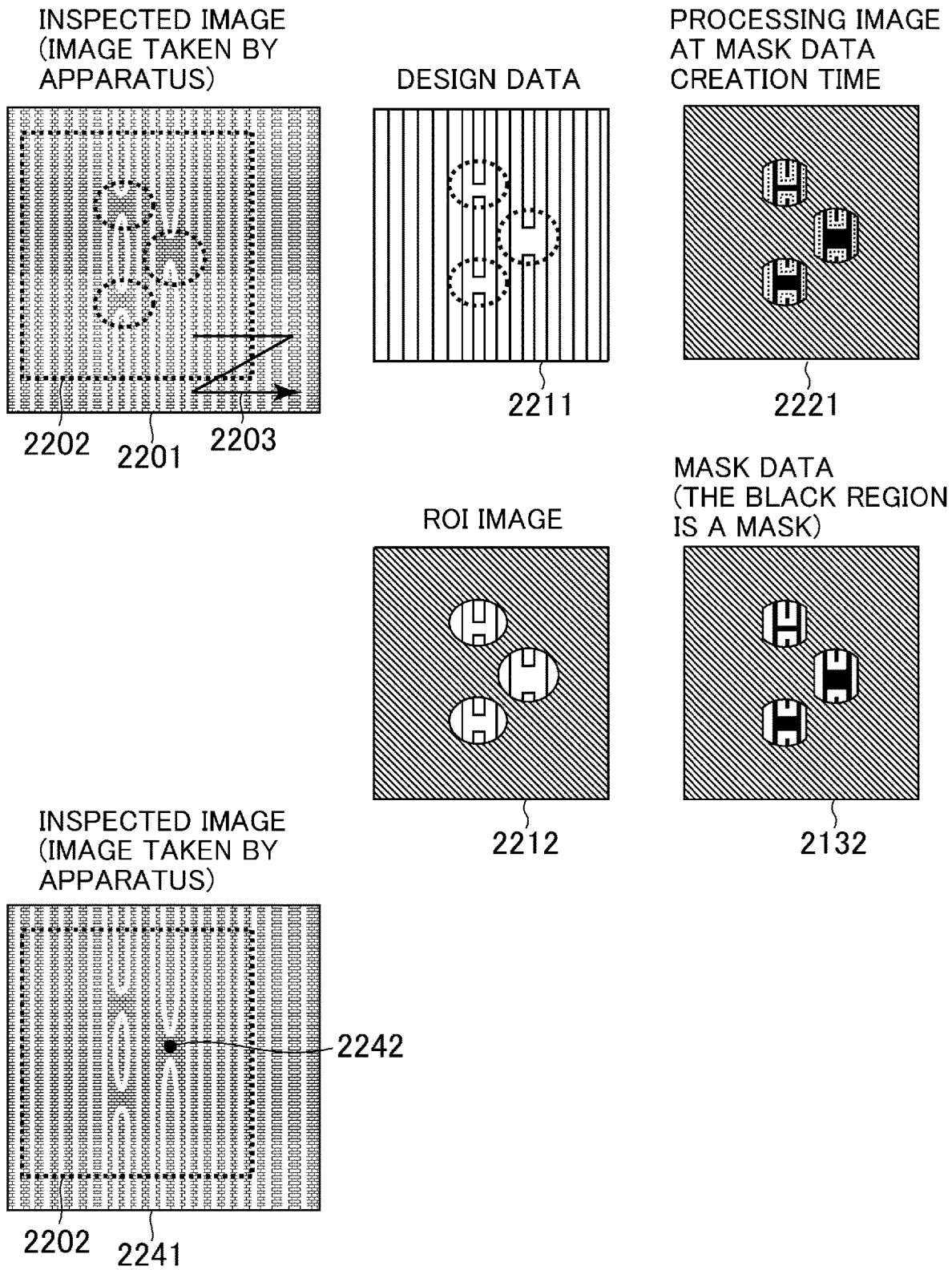
FIG. 22 is a diagram to be referred to in description of mask processing implemented on design data.

FIG. 22 is an explanatory diagram to be referred to in the following description of a method for generating mask data by adoption of a different technique in a method of carrying out the mask-processing execution pattern matching processing by making use of a design-data ROI described earlier by referring to FIG. 21 (for the sixth embodiment). Up to the operation to generate an ROI from design data 2211 by adoption of the ROI generation method explained before by referring to FIG. 8, the method explained by referring to FIG. 22 is the same as that described earlier by referring to FIG. 21 (for the sixth embodiment).

In an extracted ROI (that is, a white round region of an ROI image 2212), only a region close to the design data is taken as a region for which the evaluation of the degree of similarity is carried out. Other regions are each taken as a mask region. For example, as shown in an intermediate processing image 2221 at a mask-data creation time, a dashed-line periphery which is design data inside an ROI is taken as a similarity-degree evaluation region (a white portion). This region typically generates the region of a design-data portion by carrying out expansion processing. A white-color region in the mask data 2132 is taken as a region for which the evaluation of the degree of similarity is carried out whereas a black-color region other than the white-color region is taken as a mask region.

Thus, for example, as shown in an inspected image 2241, even if a more than enough pattern 2242 is copied in a portion other than a region having a pattern edge inside an ROI, the more than enough pattern 2242 can be excluded from the evaluation of the degree of similarity by carrying out mask processing so that it is possible to carry out robust pattern matching which is not affected badly by the more than enough pattern 2242.

Eighth Embodiment

FIG. 23 is explanatory diagrams to be referred to in the following description of a method for automatically selecting a template region from design data by making use of an ROI generated from the design data. By adoption of this method, it is possible to automatically select a template, which allows more robust matching to be carried out, from design data. FIG. 23(a) is an explanatory diagram showing a flow of processing carried out to select a template.

As shown in the figure, first of all, the ROI generation processing 2302 explained earlier by referring to FIG. 8 is carried out in order to generate an ROI image 2303 from design data 2301. Then, template select processing 2304 is carried out in order to select a template 2305 from the ROI image 2303. FIG. 23(b) is an explanatory diagram to be referred to in the following description of an example of the template selection. In the design data 2301, a region 2302 shown by a dashed line is an ROI. In the template select processing 2304, a template is selected in such a way that a large number of ROIs are included in the template.

The design data 2301 includes regions 2303, 2304 and 2305 each serving as a candidate for the template. Since the region 2303 includes most ROIs, the region 2303 is selected as the template. If a large number of characteristic regions are included in the template in pattern matching, the pattern matching tends to be robust. By selecting a region including a large number of ROIs which are each a characteristic region as the template as is the case with this method, the pattern matching becomes robust. If the size of the template has been determined, a position of the template is selected in such a way that the region of the template includes a larger number of ROIs.

If the size of the template has not been determined, on the other hand, a template size and a template position is selected in such a way that a larger number of ROIs are included in a range allowed by the size of the template. It is to be noted that the determination of whether or not a large number of ROIs are included in the template is not limited to determination based on summation of the areas of the ROIs. Instead, the template can also be selected in such a way that the ratio of the sum of the areas of the ROIs to the area of the template is maximized. In addition, in the case of weighted ROIs explained earlier by referring to FIG. 19, the sum of weights can also be used.

Ninth Embodiment

FIG. 24 includes explanatory diagrams to be referred to in the following description of an ROI generation method different from the method explained before by referring to FIG. 8. To be more specific, FIG. 24(a) is an explanatory diagram showing the flow of processing. As shown in the figure, corner-point extraction processing 2402 is carried out on design data 2401 whereas corner-point peripheral-region extraction processing 2403 is carried out on the result of the corner-point extraction processing 2402 in order to generate an ROI image 2404. Details of the processing are explained by referring to FIG. 24(b). As shown in the figure, a corner point (round portions) 2406 is extracted as a characteristic region from the design data 2401.

As corner extraction methods based on generally known image processing, there are a Harris corner detection method and a SUZAN corner detection method. However, the corner extraction methods are by no means limited to these corner detection methods. That is to say, the corner extraction method can be any method as long as the method is a method for detecting a corner. Then, on the basis of a corner point 2406, a corner-point peripheral region (round portion) 2407 is generated. For example, by carrying out expansion processing on the corner point, the corner-point peripheral region can be generated. The generation method is by no means limited to the expansion processing. That is to say, the generation method can be any method as long as the method can be adopted to generate a corner-point peripheral region. The corner-point peripheral region 2407 is an ROI (a white-color region) of the ROI image 2404.

Tenth Embodiment

Figure 20:
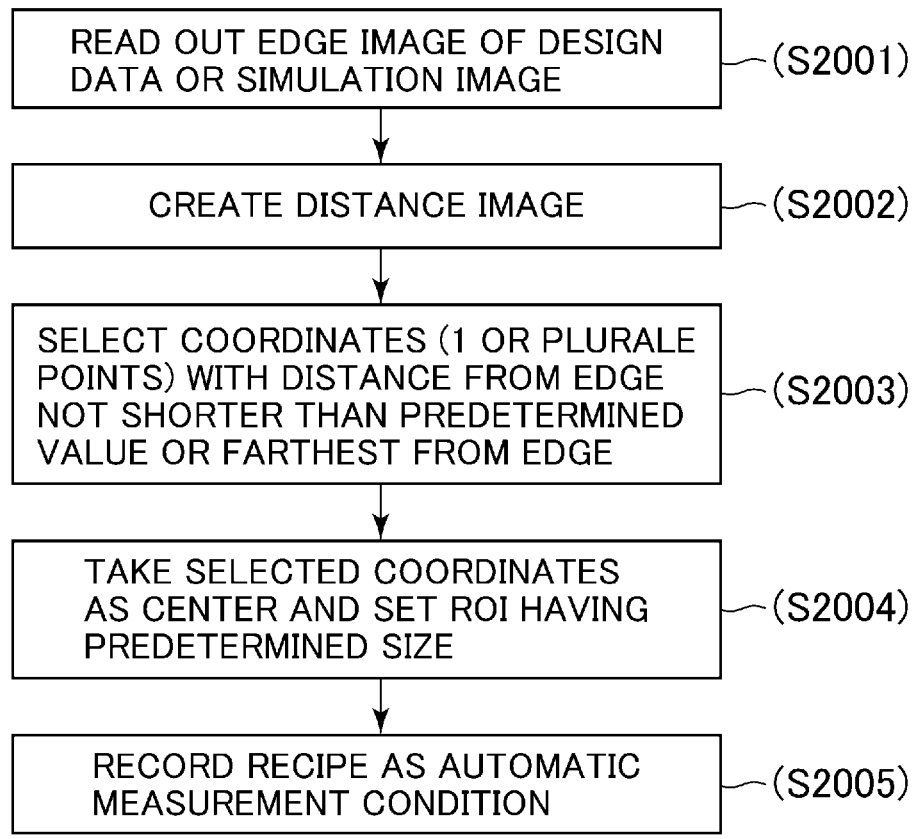
FIG. 20 is a flowchart representing a process of extracting an ROI by making use of a distance conversion image.

The following description explains another technique for setting an ROI (Region Of Interest). An embodiment described before is an example in which expansion processing is carried out on an edge image (a contour-line image) of design data or the edge of a simulation image in order to find an ROI center. However, in place of the expansion processing or in conjunction with the expansion processing, an ROI can also be extracted by making use of a distance conversion image. FIG. 20 is a flowchart representing a process of extracting an ROI on the basis of a distance conversion image.

As shown in the figure, an edge image of design data or a simulation image is retrieved from a design-data recording medium 1314 (step 2001). Then, a distance conversion image is created (step 2002). The distance conversion image used in this embodiment is created by appending a signal to each pixel. The signal is a signal according to the distance to an edge, the position of which is taken as a reference. For example, the longer the distance, the larger the value of the positional information appended to the pixel. The distance conversion image creation method itself is a generally known method and can be selected from a variety of techniques.

In the case of a periodical pattern like the one shown in FIG. 2, a position farthest from the edge is a portion with an interrupted pattern. By creating a distance conversion image, it is possible to identify a position farthest from the edge as an ROI candidate position or a plurality of ROI candidate positions. In the case of this embodiment, a position farthest from the edge or a portion separated away from the edge by at least a distance determined in advance is selected as the center of an ROI (step 2003).

In addition, as a merit of making use of a distance conversion image, the application is possible even if the distance between the edges of an interrupted (in the y direction) portion is shorter than the distance (in the x direction) between lines. In the case of the expansion processing, if the distance between the edges of an interrupted (in the y direction) portion is shorter than the distance between lines, the interrupted portion is undesirably painted first so that it is difficult to set an ROI in the interrupted portion. If based on a distance image, on the other hand, it is possible to selectively extract a portion separated from the edge by a specific distance so that, for example, a portion separated from the edge by a shortest distance or a portion satisfying a distance condition determined in advance is selectively extracted, making it possible to select a proper ROI center. (An example of the portion satisfying a distance condition determined in advance is a portion having information different from the distance between lines.)

A region provided with a predetermined size and centered at the ROI center position is set as an ROI (step 2004). Then, this measurement condition is recorded in a recipe as an automatic measurement condition (step 2005).

In accordance with the configuration like the one described above, without carrying out expansion processing, an ROI can be set at a proper position.

Eleventh Embodiment

Figure 25:
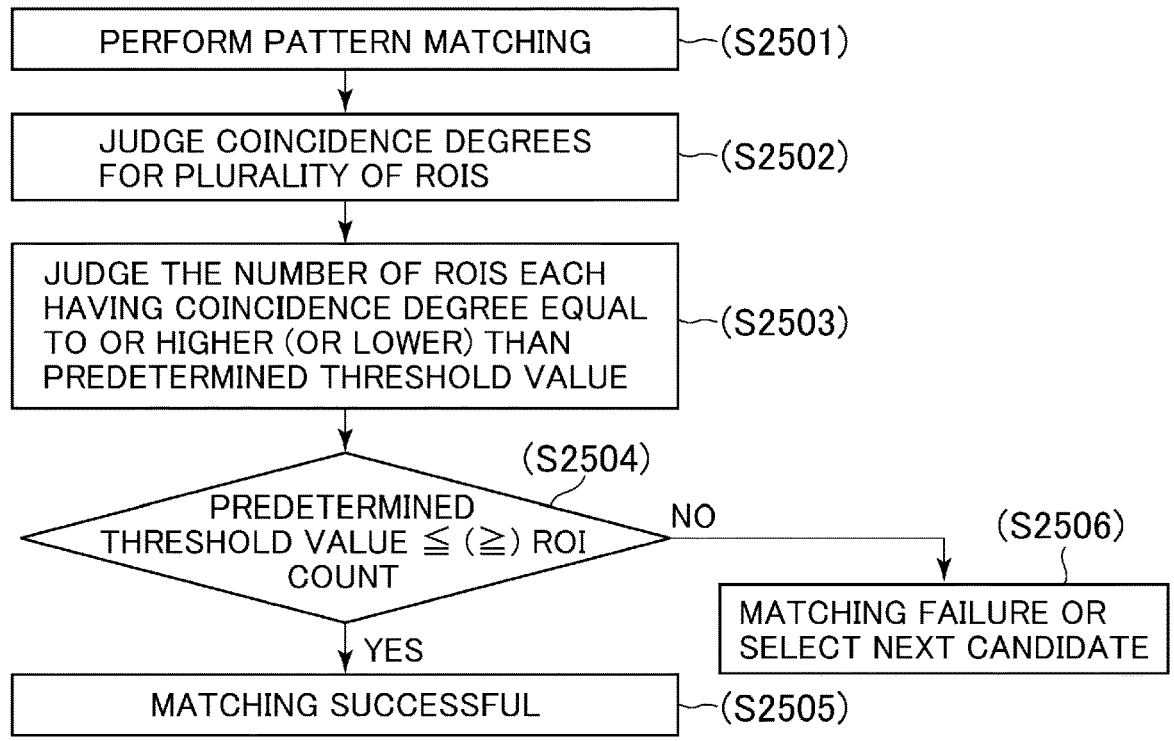
FIG. 25 is a flowchart representing a process of verifying matching by taking the number of ROIs satisfying a condition determined in advance as an evaluation value.

Next, the following description explains an example as an embodiment for verifying matching by providing a plurality of ROIs and evaluating the ROIs. FIG. 25 is a flowchart representing this process. As shown in the figure, ordinary pattern matching is carried out (step 2501). Then, a plurality of ROIs are evaluated (step 2502). Then, the number of ROIs each having an evaluation value (such as the degree of coincidence) satisfying a condition determined in advance is found (step 2503). Then, the number of ROIs is examined in order to determine whether or not the number satisfies a condition determined in advance (step 2504). For example, determination whether the number of ROIs each having a coincidence degree equal to or greater than a value determined in advance is equal to or greater than a number determined in advance or determination whether the number of ROIs each having a non-coincidence degree equal to or greater than a value determined in advance is equal to or smaller than a number determined in advance is carried out.

If the number of ROIs satisfies a condition determined in advance, the matching is determined to have been carried out successfully (step 2505). If the number of ROIs does not satisfy the condition determined in advance, on the other hand, the matching is determined to have ended in a failure (step 2506). If the matching is determined to have ended in a failure, the flow of the process goes back to step 2501 at which the next candidate is selected or processing such as an operation to generate an error message or the like is carried out.

As described above, instead of merely verifying the matching by simply making use of an evaluation value inside an ROI, a plurality of ROIs are provided and the number of ROIs each satisfying a condition is taken as a criterion for example in order to partially deform the pattern so that, even if the evaluation value is an abnormal value, the matching can be verified properly.

Figure 26:
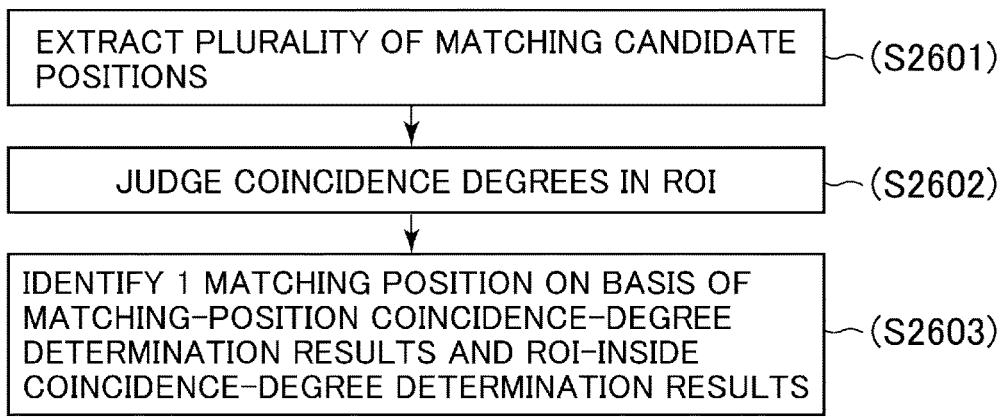
FIG. 26 is a flowchart representing a process of identifying a correct matching position among a plurality of matching candidates.

In addition, in the explanation given so far, in order to verify one matching result, an ROI is evaluated. However, a plurality of matching candidates are selected in the first pattern matching and an ROI is evaluated in order to select only proper matching candidate from the matching candidates selected in the first pattern matching. FIG. 26 is a flowchart representing this process.

As shown in the figure, a plurality of matching candidate positions are selected (step 2601), (Examples of the matching candidate positions are positions each having a coincidence degree higher than a value determined in advance or n positions with relatively high coincidence degrees). Then, on the basis of determination of the inside of an ROI, one matching position is selected from the matching candidate positions (step 2603). In this case, a coincidence degree in the first matching and the best one among ROI evaluation statistical values can be selected. As an alternative, it is also possible to make determination on the basis of only evaluation values inside the ROI.

As described above, it is possible to make use of ROI evaluation not only in verification of matching, but also in selection of a proper matching candidate from a plurality of matching candidates.

Twelfth Embodiment

Figure 27:
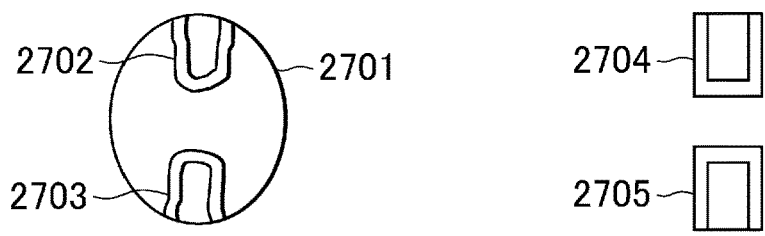
FIG. 27 is a diagram to be referred to in description of evaluation of an ROI by making use of a plurality of templates.
Figure 28:
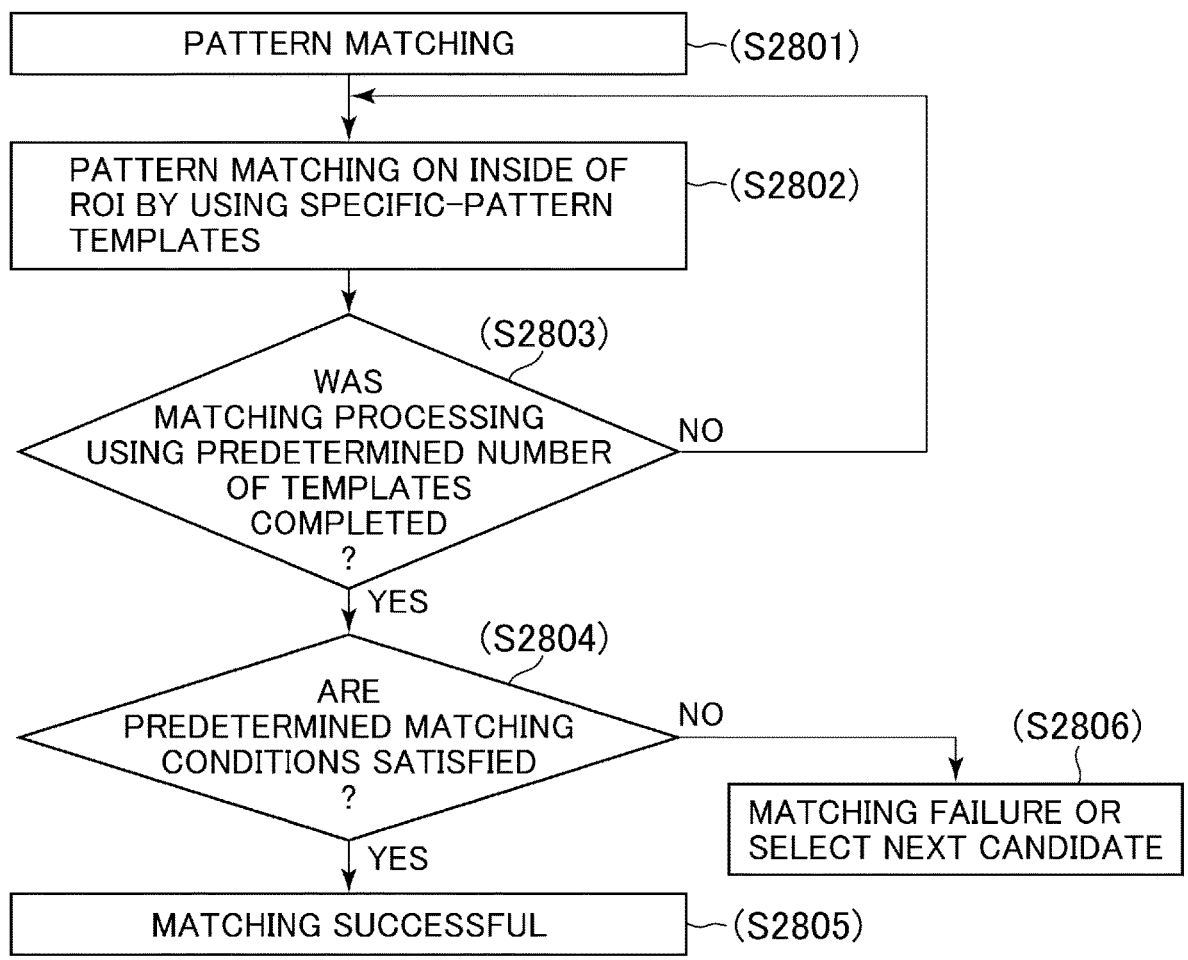
FIG. 28 is a flowchart representing a process of evaluating an ROI by making use of a plurality of templates.

Next, the following description explains an embodiment for carrying out ROI evaluation by making use of a plurality of templates. FIG. 27 is a diagram showing an ROI 2701 including two line ends 2702 and 2703. For example, in the case of a pattern created by adoption of a double exposure method or the like or a pattern created by being partially shifted by adoption of the OPC (Optical Proximity Correction), it is quite within the bounds of possibility that the relative positions of the two line ends are changed. In this embodiment, there are prepared a plurality of templates for ROI evaluation and, on the basis of coincidence-degree evaluation of the templates, matching is verified.

As shown in FIG. 27, pattern matching is carried out after templates 2704 and 2705 for ROI evaluation have been prepared. First of all, ordinary pattern matching is carried out (step 2801). Then, pattern matching making use of the templates 2704 and 2705 is carried out for the inside of an ROI 2701 (step 2802). Then, whether or not the matching making use of a predetermined plurality of templates has been completed is determined. If the matching has been completed, whether or not results of the matching making use of the templates (three or more templates are OK) satisfy a condition determined in advance is determined (steps 2804, 2805). If the results of the matching satisfy the condition determined in advance, the watching carried out at step 2801 is determined to have been successful (step 2805). Then, the next processing such as pattern measurement is carried out. If the results of the matching do not satisfy the condition determined in advance, on the other hand, the matching carried out at step 2801 is determined to have been unsuccessful (step 2806). Then, the next candidate is selected or processing such as an operation to generate an error message or the like is carried out.

Note that the determination of whether or not the results of the matching satisfy the condition determined in advance is determination of whether or not it is possible to identify a portion with a coincidence degree equal to or higher than a predetermined value in accordance with, for example, matching making use of two templates. In accordance with such determination, it is possible to determine whether or not two patterns exist even if the positions of the two patterns are relatively shifted from each other. Thus, the matching can be verified in a stable manner independent of conditions for creation of the patterns. In addition, it is quite within the bounds of possibility that a specific one of the patterns is created by being shifted to the outside of the ROI. Thus, when this specific pattern is detected, the matching can be determined to have been carried out successfully or, when this specific pattern is detected, the threshold value of the coincidence degree of the other pattern can be lowered prior to the verification.

In the ordinary pattern matching, a variety of patterns exist in a search region. Thus, matching carried out in pattern units as explained in the description of this embodiment is difficult. Much like this embodiment, however, in accordance with a technique of limiting an area subjected to pattern matching to an ROI, types of the pattern shape in a search object are limited. Thus, matching making use of a template having a simple shape can be verified.

In addition, a plurality of verification templates having different inter-pattern relative positions are prepared in advance. Then, if a coincidence degree higher than a predetermined value is obtained for one of them, the matching can be determined to have been carried out successfully.

DESCRIPTION OF REFERENCE NUMERALS

101: Electron-microscope mirror body
103: Control apparatus
104: Computer
109: Display unit
201: Inspected image
301: Design-data image
402: Design data
404: Design-data ROI generation section
405: Design-data ROI image
408: Position-alignment determination section
601: Inspected-image ROI generation section
602: Inspected-image ROI image

The invention claimed is:
1. A pattern matching apparatus comprising:
an image processing section configured to carry out pattern matching on an image by making use of a template created on the basis of a design data image created from design data,
wherein said template comprises a design data region of interest template having a plurality of regions of interest each of which corresponds to a characteristic region of said design data image,
wherein, after carrying out said pattern matching, said image processing section determines whether or not an image included in a predetermined evaluation region inside said template satisfies a predetermined condition, and
wherein said evaluation region is obtained by extracting an unpainted portion by selection of an area of an image for expansion processing corresponding to an edge of a pattern included in the image; and execution of selective expansion processing for the edge of the pattern included in the selected area of said design data image, wherein only the selected area of the image is subjected to said expansion processing, and non-selected areas of the image are not expanded, and wherein said expansion processing comprises thickening of said edge by setting a gradation of pixels adjacent to pixels corresponding to said edge to a same level as a gradation of said pixels corresponding to said edge.

2. The pattern matching apparatus according to claim 1, wherein said evaluation region is a region obtained by carrying out expansion processing on said unpainted portion.

3. The pattern matching apparatus according to claim 1 wherein said image processing section carries out said determination in accordance with whether or not said evaluation region includes a predetermined pattern.

4. The pattern matching apparatus according to claim 1 wherein said template includes a repetitive pattern.

5. The pattern matching apparatus according to claim 4 wherein said evaluation region includes a portion in which the periodicity of said repetitive pattern is interrupted.

6. The pattern matching apparatus according to claim 1 wherein said evaluation region is small in comparison with said template.

7. The pattern matching apparatus according to claim 1 wherein said template is created by carrying out expansion processing selectively in a longitudinal direction or a transversal direction with respect to an image obtained on the basis of said design data.

8. The pattern matching apparatus according to claim 1 wherein said image processing section generates said evaluation region in such a way that pixel values corresponding to weights are different at a periphery and a center.

9. The pattern matching apparatus according to claim 8 wherein said image processing section determines whether or not said evaluation region includes a predetermined pattern in accordance with a value obtained as a result of carrying out an operation on pixel values of said evaluation region.

10. The pattern matching apparatus according to claim 1 wherein said evaluation region is a region extracted by carrying out expansion processing on a corner point extracted from said design data.

11. A non-transitory computer-readable medium upon which is embodied a sequence of programmable instructions to be executed by a computer to carry out pattern matching on an image by performing the following:

performing pattern matching on an image;

generating a design data region of interest template having a plurality of regions of interest each of which corresponds to a characteristic region of a design data image; and determining, using the design data region of interest template created on the basis of design data, after executing said program to carry out said pattern matching, whether or not said image included in a predetermined evaluation region inside said template satisfies a predetermined condition, wherein said evaluation region is obtained by extracting an unpainted portion by selection of an area of an image for expansion processing corresponding to an edge of a pattern included in the image; and execution of selective expansion processing for the edge of the pattern included in the selected area of the image obtained on the basis of said design data, wherein only the selected area of the image is subjected to said expansion processing, and non-selected areas of the image are not expanded, and wherein said expansion processing comprises thickening of said edge by setting a gradation of pixels adjacent to pixels corresponding to said edge to a same level as a gradation of said pixels corresponding to said edge.

12. The non-transitory computer-readable medium according to claim 11, wherein said instructions further cause said computer to generate said evaluation region by carrying out expansion processing on said unpainted portion.

* * * * *